US008409988B2

(12) United States Patent
Takasawa et al.

(10) Patent No.: US 8,409,988 B2
(45) Date of Patent: Apr. 2, 2013

(54) METHOD OF MANUFACTURING SEMICONDUCTOR DEVICE AND SUBSTRATE PROCESSING APPARATUS

(75) Inventors: Yushin Takasawa, Toyama (JP); Hajime Karasawa, Toyama (JP); Yoshiro Hirose, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 114 days.

(21) Appl. No.: 13/115,578

(22) Filed: May 25, 2011

(65) Prior Publication Data

US 2011/0294280 A1    Dec. 1, 2011

(30) Foreign Application Priority Data

May 25, 2010  (JP) ................................. 2010-119766

(51) Int. Cl.
*H01L 21/44* (2006.01)

(52) U.S. Cl. . 438/680; 438/513; 438/769; 257/E21.006; 257/E21.17; 257/E21.218; 257/E21.267; 257/E21.278; 257/E21.293; 257/E21.311; 257/E21.32

(58) Field of Classification Search .................. 438/680, 438/769, 311, 513, 742, 905, 913; 257/E21.006, 257/E21.17, E21.218, E21.267, E21.278, 257/E21.293, E21.311, E21.32
See application file for complete search history.

(56) References Cited

U.S. PATENT DOCUMENTS

| 7,544,398 | B1 * | 6/2009 | Chang et al. .................. 427/537 |
| 7,846,644 | B2 * | 12/2010 | Irving et al. .................. 430/313 |
| 8,093,140 | B2 * | 1/2012 | Chen et al. .................... 438/482 |
| 2010/0130024 | A1 | 5/2010 | Takasawa et al. |

FOREIGN PATENT DOCUMENTS

| JP | 2007-048926 A | 2/2007 |
| JP | 2007-081427 A | 3/2007 |
| JP | 2008-502805 A | 1/2008 |
| JP | 2008-227460 A | 9/2008 |
| JP | 2010-153795 A | 7/2010 |
| WO | 2005/124849 A2 | 12/2005 |

* cited by examiner

*Primary Examiner* — David Nhu
(74) *Attorney, Agent, or Firm* — Volpe And Koenig, P.C.

(57) ABSTRACT

Provided are a method of manufacturing a semiconductor device and a substrate processing apparatus capable of improving defects of conventional CVD and ALD methods, satisfying requirements of film-thinning, and realizing high film-forming rate. The method includes forming a first layer including a first element being able to become solid state by itself on a substrate by supplying a gas containing the first element into a process vessel in which the substrate is accommodated under a condition that a CVD reaction occurs, and forming a second layer including the first element and a second element being unable to become solid state by itself by supplying a gas containing the second element into the process vessel to modify the first layer, wherein a cycle including the forming of the first layer and the forming of the second layer is performed at least once to form a thin film including the first and second elements and having a predetermined thickness.

12 Claims, 14 Drawing Sheets

METHOD OF MANUFACTURING SEMICONDUCTOR DEVICE AND SUBSTRATE PROCESSING APPARATUS

CROSS-REFERENCE TO RELATED PATENT APPLICATION

This application claims priority to and the benefit of Japanese Patent Application No. 2010-119766 filed on May 25, 2010, the disclosure of which is incorporated herein by reference.

FIELD OF THE INVENTION

The present invention relates to a semiconductor device manufacturing method including a step of forming a thin film on a substrate, and a substrate processing apparatus.

DESCRIPTION OF THE RELATED ART

Semiconductor device manufacturing processes include a step of forming an insulating film such as a silicon oxide ($SiO_2$) film or a silicon nitride ($Si_3N_4$) film on a substrate, and a step of forming a conductive film such as a titanium nitride (TiN) film or a tantalum nitride (TaN) film on the substrate. Since the silicon oxide film has good properties such as excellent insulation characteristics and a low dielectric constant, the silicon oxide film is widely used as an insulating film or an interlayer film. In addition, since the silicon nitride film has good properties such as excellent insulation characteristics, corrosion resistance, a dielectric constant, and film stress controllability, the silicon nitride film is widely used as an insulating film, a mask film, a charge storage film, and a stress control film. Further, because the titanium nitride film or the tantalum nitride film has good properties such as electrode characteristics and barrier characteristics, the titanium nitride film or the tantalum nitride film is widely used as a metal electrode film or a barrier metal film. As a method of forming such a film, a chemical vapor deposition (CVD) method or an atomic layer deposition (ALD) method is used.

SUMMARY OF THE INVENTION

In recent times, miniaturization of semiconductor devices is further needed and thinning of the films used in the semiconductor devices is also further needed. While a high film-forming rate can be obtained through the conventional CVD method, it is difficult to accomplish thinning requirements of the films used in the semiconductor device. In addition, while requirements of the film-thinning can be satisfied through the ALD method, it is difficult to realize a high film-forming rate.

Therefore, it is an object of the present invention to provide a method of manufacturing a semiconductor device and a substrate processing apparatus that are capable of satisfying requirement of the film-thinning and realizing a high film-forming rate by improving defects of the conventional CVD method and ALD method.

According to an aspect of the present invention, there is provided a method of manufacturing a semiconductor device including:

(a) forming a first layer including a first element being able to become solid state by itself on a substrate by supplying a gas containing the first element into a process vessel accommodating the substrate under a condition where a CVD reaction is caused;

(b) modifying the first layer by supplying a gas containing a second element being unable to become solid state by itself into the process vessel to form a second layer including the first element and the second element; and (c) performing a cycle comprising the steps (a) and (b) at least once to form a thin film having a predetermined thickness and including the first element and the second element.

According to another aspect of the present invention, there is provided a method of manufacturing a semiconductor device including:

(a) forming a first layer including a first element being able to become solid state by itself on a substrate by supplying a gas containing the first element into a process vessel accommodating the substrate under a condition where a CVD reaction is caused;

(b) supplying a gas containing a second element being able to become solid state by itself or being unable to become solid state by itself into the process vessel to form a second layer including the first element and the second element by forming a layer including the second element on the first layer or by modifying the first layer;

(c) modifying the second layer by supplying a gas containing a third element being unable to become solid state by itself into the process vessel to form a third layer including the first element, the second element and the third element; and (d) performing a cycle comprising the steps (a) through (c) at least once to form a thin film having a predetermined thickness and including the first element, the second element and the third element.

According to still another aspect of the present invention, there is provided a method of manufacturing a semiconductor device including:

(a) forming a first layer including a first element being able to become solid state by itself on a substrate by supplying a gas containing the first element into a process vessel accommodating the substrate under a condition where a CVD reaction is cased;

(b) supplying a gas containing a second element being able to become solid state by itself or being unable to become solid state by itself into the process vessel to form a second layer including the first element and the second element by forming a layer including the second element on the first layer or by modifying the first layer;

(c) supplying a gas containing a third element being able to become solid state by itself or being unable to become solid state by itself into the process vessel to form a third layer including the first element, the second element and the third element by forming a layer including the third element on the second layer or by modifying the second layer; and (d) modifying the third layer by supplying a gas containing a fourth element being unable to become solid state by itself into the process vessel to form a fourth layer including the first element, the second element, the third element and the fourth element; and (e) performing a cycle comprising the steps (a) through (d) at least once to form a thin film having a predetermined thickness and including the first element, the second element, the third element and fourth element.

According to yet another aspect of the present invention, there is provided a substrate processing apparatus including:

a process vessel configured to accommodate a substrate;

a first element-containing gas supply system configured to supply a gas containing a first element being able to become solid state by itself into the process vessel;

a second element-containing gas supply system configured to supply a gas containing a second element being unable to become solid state by itself into the process vessel;

a pressure regulating unit configured to regulate a pressure in the process vessel; and a controller, wherein the controller is configured to control the pressure regulating unit, the first element-containing gas supply system, and the second element-containing gas supply system so as to: form a first layer including the first element on the substrate by supplying the gas containing the first element into the process vessel in which the substrate is accommodated under a condition that a CVD reaction occurs; and form a second layer including the first element and the second element by supplying the gas containing the second element into the process vessel to modify the first layer, wherein a cycle including the forming of the first layer and the forming of the second layer is performed at least once to form a thin film including the first and second elements and having a predetermined thickness.

According to yet another aspect of the present invention, there is provided a substrate processing apparatus including:

a process vessel configured to accommodate a substrate;

a first element-containing gas supply system configured to supply a gas containing a first element being able to become solid state by itself into the process vessel;

a second element-containing gas supply system configured to supply a gas containing a second element being able to become solid state by itself or being unable to become solid state by itself into the process vessel;

a third element-containing gas supply system configured to supply a gas containing a third element being unable to become solid state by itself into the process vessel;

a pressure regulating unit configured to regulate a pressure in the process vessel; and a controller, wherein the controller is configured to control the pressure regulating unit, the first element-containing gas supply system, the second element-containing gas supply system, and the third element-containing gas supply system so as to: form a first layer including the first element on the substrate by supplying the gas containing the first element into the process vessel in which the substrate is accommodated under a condition that a CVD reaction occurs; form a second layer including the first element and the second element by supplying the gas containing the second element into the process vessel, wherein the second layer is formed by forming a layer including the second element on the first layer, or the second layer is formed by modifying the first layer; and form a third layer including the first element, the second element, and the third element by supplying the gas containing the third element into the process vessel to modify the second layer, wherein a cycle including the forming of the first layer, the forming of the second layer, and the forming of the third layer is performed at least once to form a thin film including the first to third elements and having a predetermined thickness.

According to yet another aspect of the present invention, there is provided a substrate processing apparatus including:

a process vessel configured to accommodate a substrate;

a first element-containing gas supply system configured to supply a gas containing a first element being able to become solid state by itself into the process vessel;

a second element-containing gas supply system configured to supply a gas containing a second element being able to become solid state by itself or being unable to become solid state by itself into the process vessel;

a third element-containing gas supply system configured to supply a gas containing a third element being able to become solid state by itself or being unable to become solid state by itself into the process vessel;

a fourth element-containing gas supply system configured to supply a gas containing a third element being able to become solid state by itself into the process vessel;

a pressure regulating unit configured to regulate a pressure in the process vessel; and a controller, wherein the controller is configured to control the pressure regulating unit, the first element-containing gas supply system, the second element-containing gas supply system, the third element-containing gas supply system, and the fourth element-containing gas supply system so as to: form a first layer including the first element on the substrate by supplying the gas containing the first element into the process vessel in which the substrate is accommodated under a condition that a CVD reaction occurs; form a second layer including the first element and the second element by supplying the gas containing the second element into the process vessel, wherein the second layer is formed by forming a layer including the second element on the first layer, or the second layer is formed by modifying the first layer; form a third layer including the first element, the second element, and the third element by supplying the gas containing the third element into the process vessel, wherein the third layer is formed by forming a layer including the third element on the second layer, or the third layer is formed by modifying the second layer; and form a fourth layer including the first to fourth elements by supplying the gas containing the fourth element into the process vessel to modify the third layer, wherein a cycle including the forming of the first layer, the forming of the second layer, the forming of the third layer, and the forming of the fourth layer is performed at least once to form a thin film including the first to fourth elements and having a predetermined thickness.

According to the present invention, a method of manufacturing a semiconductor device and a substrate processing apparatus that are capable of satisfying requirements of film-thinning and realizing a high film-forming rate by improving defects of conventional CVD and ALD methods can be provided.

DETAILED DESCRIPTION OF THE PREFERRED EMBODIMENTS

Embodiments of the present invention will be described hereinafter with reference to the attached drawings.

Figure 1:
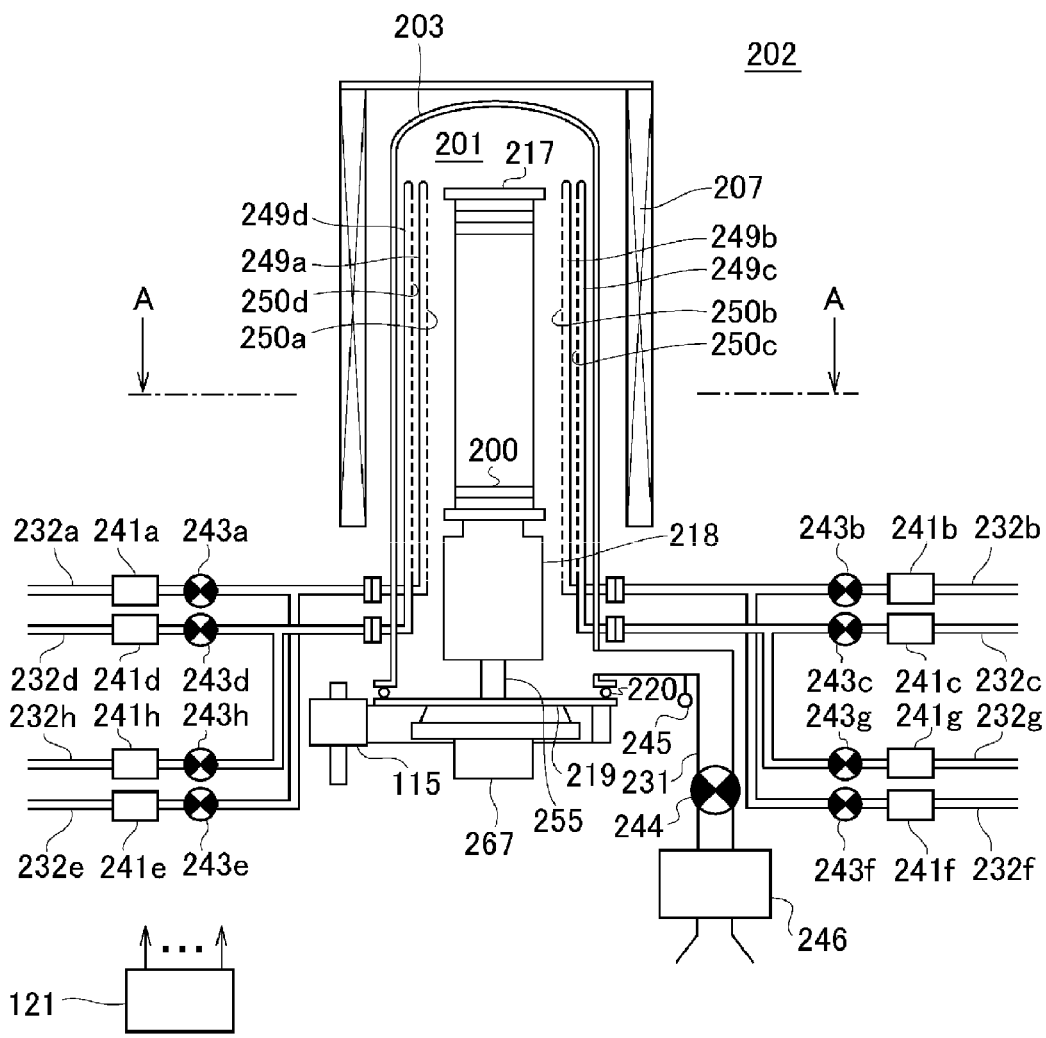
FIG. 1 is a vertical cross-sectional view schematically illustrating a vertical process furnace of a substrate processing apparatus according to an exemplary embodiment of the present invention.
Figure 2:
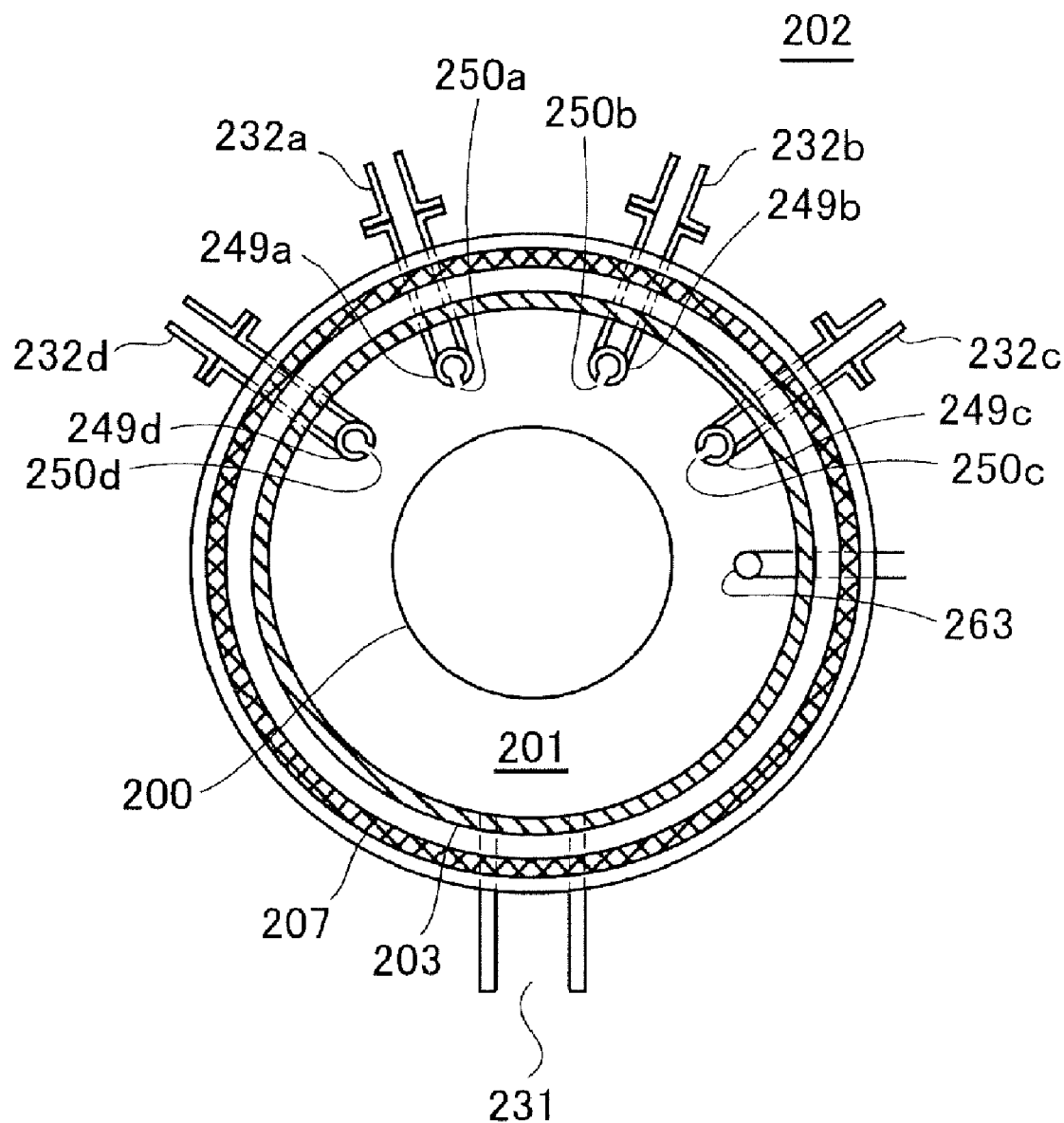
FIG. 2 is a cross-sectional view taken along line A-A of FIG. 1 schematically illustrating the vertical process furnace according to the exemplary embodiment of the present invention.

FIG. 1 is a vertical cross-sectional view schematically illustrating a vertical process furnace 202 of a substrate processing apparatus according to an exemplary embodiment of the present invention, and FIG. 2 is a cross-sectional view taken along line A-A of FIG. 1 schematically illustrating the vertical process furnace 202 according to the exemplary embodiment of the present invention.

As shown in FIG. 1, the process furnace 202 includes a heater 207 used as a heating unit (heating mechanism). The heater 207 has a cylindrical shape and is vertically installed in a state in which the heater 207 is supported on a heater base (not shown) which is a holding plate. As will be described later, the heater 207 is also used as an activation mechanism for activating a gas by heat.

Inside the heater 207, a reaction tube 203 constituting a reaction vessel (process vessel) is installed concentrically with the heater 207. The reaction tube 203 is made of a heat-resistant material such as quartz ($SiO_2$) or silicon carbide (SiC) and has a cylindrical shape with a top side closed and a bottom side opened. A hollow part of the reaction tube 203 forms a process chamber 201. The process chamber 201 is configured to accommodate substrates such as wafers 200 using a boat 217, which will be described later, such that the wafers 200 are horizontally positioned and vertically arranged in multiple stages.

A first nozzle 249a, a second nozzle 249b, a third nozzle 249c and a fourth nozzle 249d are installed in the process chamber 201 through the lower part of the reaction tube 203. A first gas supply pipe 232a, a second gas supply pipe 232b, a third gas supply pipe 232c and a fourth gas supply pipe 232d are connected to the first nozzle 249a, the second nozzle 249b, the third nozzle 249c and the fourth nozzle 249d, respectively. In this way, four nozzles 249a, 249b, 249c and 249d, and four gas supply pipes 232a, 232b, 232c and 232d are installed at the reaction tube 203 such that a plurality of kinds of gases, here, four kinds of gases, can be supplied into the reaction tube 203.

A flow rate controller (a flow rate control unit) such as a mass flow controller (MFC) 241a, and an on-off valve such as a valve 243a are sequentially installed at the first gas supply pipe 232a from an upstream side of the first gas supply pipe 232a. In addition, a first inert gas supply pipe 232e is connected to a downstream side of the valve 243a of the first gas supply pipe 232a. A flow rate controller (a flow rate control unit) such as an MFC 241e, and an on-off valve such as a valve 243e are sequentially installed at the first inert gas supply pipe 232e from an upstream side of the first inert gas supply pipe 232e. Further, the above-described first nozzle 249a is connected to a leading end of the first gas supply pipe 232a. In an arc-shaped space between an inner wall of the reaction tube 203 and wafers 200, the first nozzle 249a is erected such that the first nozzle 249a extends upward from a lower side to an upper side along the inner wall of the reaction tube 203 in a direction in which the wafers 200 are stacked. The first nozzle 249a is an L-shaped long nozzle. Gas supply holes 250a are formed in a side surface of the first nozzle 249a to supply a gas. The gas supply holes 250a are opened toward a center of the reaction tube 203. The gas supply holes 250a are formed at a plurality of positions along the lower side to the upper side of the reaction tube 203, have the same opening area and are arranged at the same opening pitch. A first gas supply system is constituted mainly by the first gas supply pipe 232a, the MFC 241a, the valve 243a and the first nozzle 249a. In addition, a first inert gas supply system is constituted mainly by the first inert gas supply pipe 232e, the MFC 241e and the valve 243e.

A flow rate controller (a flow rate control unit) such as an MFC 241b, and an on-off valve such as a valve 243b are sequentially installed at the second gas supply pipe 232b from an upstream side of the second gas supply pipe 232b. In addition, a second inert gas supply pipe 232f is connected to a downstream side of the valve 243b of the second gas supply pipe 232b. A flow rate controller (a flow rate control unit) such as an MFC 241f, and an on-off valve such as a valve 243f are sequentially installed at the second inert gas supply pipe 232f from an upstream side of the second inert gas supply pipe 232e. In addition, the above-described second nozzle 249b is connected to a leading end of the second gas supply pipe 232b. In an arc-shaped space between the inner wall of the reaction tube 203 and the wafers 200, the second nozzle 249b is erected such that the second nozzle 249b extends upward from the lower side to the upper side along the inner wall of the reaction tube 203 in a direction in which the wafers 200 are stacked. The second nozzle 249b is an L-shaped long nozzle. Gas supply holes 250b are formed in a side surface of the second nozzle 249a to supply a gas. The gas supply holes 250b are opened toward the center of the reaction tube 203. The gas supply holes 250b are formed at a plurality of positions along the lower side to the upper side of the reaction tube 203, have the same opening area and are arranged at the same opening pitch. A second gas supply system is constituted mainly by the second gas supply pipe 232b, the MFC 241b, the valve 243b and the second nozzle 249b. In addition, a second inert gas supply system is constituted mainly by the second inert gas supply pipe 232f, the MFC 241f and the valve 243f.

A flow rate controller (a flow rate control unit) such as an MFC 241c, and an on-off valve such as a valve 243c are sequentially installed at the third gas supply pipe 232c from an upstream side of the third gas supply pipe 232c. In addition, a third inert gas supply pipe 232g is connected to a downstream side of the valve 243c of the third gas supply pipe 232c. A flow rate controller (a flow rate control unit) such as an MFC 241g, and an on-off valve such as a valve 243g are sequentially installed at the third inert gas supply pipe 232g from an upstream side of the third inert gas supply pipe 232g. In addition, the above-described third nozzle 249c is connected to a leading end of the third gas supply pipe 232c. In an arc-shaped space between the inner wall of the reaction tube 203 and the wafers 200, the third nozzle 249c is erected such that the third nozzle 249c extends upward from the lower side to the upper side along the inner wall of the reaction tube 203 in a direction in which the wafers 200 are stacked. The third nozzle 249c is an L-shaped long nozzle. Gas supply holes 250c are formed in a side surface of the third nozzle 249c to supply a gas. The gas supply holes 250c are opened toward the center of the reaction tube 203. The gas supply holes 250c are formed at a plurality of positions along the lower side to the upper side of the reaction tube 203, have the same opening area and are arranged at the same opening pitch. A third gas supply system is constituted mainly by the third gas supply pipe 232c, the MFC 241c, the valve 243c and the third nozzle 249c. In addition, a third inert gas supply system is constituted mainly by the third inert gas supply pipe 232g, the MFC 241g and the valve 243g.

A flow rate controller (a flow rate control unit) such as an MFC 241d, and an on-off valve such as a valve 243d are sequentially installed at the fourth gas supply pipe 232d from an upstream side of the fourth gas supply pipe 232d. In addition, a fourth inert gas supply pipe 232h is connected to a downstream side of the valve 243d of the fourth gas supply pipe 232d. A flow rate controller (a flow rate control unit) such as an MFC 241h, and an on-off valve such as a valve 243h are sequentially installed at the fourth inert gas supply pipe 232h from an upstream side of the fourth inert gas supply pipe 232h. In addition, the above-described fourth nozzle 249d is connected to a leading end of the fourth gas supply pipe 232d. In an arc-shaped space between the inner wall of the reaction tube 203 and the wafers 200, the fourth nozzle 249d is erected such that the fourth nozzle 249d extends upward from the lower side to the upper side along the inner wall of the reaction tube 203 in a direction in which the wafers 200 are stacked. The fourth nozzle 249d is an L-shaped long nozzle. Gas supply holes 250d are formed in a side surface of the fourth nozzle 249d to supply a gas. The gas supply holes 250d are opened toward the center of the reaction tube 203. The gas supply holes 250d are formed at a plurality of positions along the lower side to the upper side of the reaction tube 203, have the same opening area and are arranged at the same opening pitch. A fourth gas supply system is constituted mainly by the fourth gas supply pipe 232d, the MFC 241d, the valve 243d and the fourth nozzle 249d. In addition, a fourth inert gas supply system is constituted mainly by the fourth inert gas supply pipe 232h, the MFC 241h and the valve 243h.

As described above, a method of supplying the gas in this embodiment is clearly distinguished from a conventional method of supplying the gas. In the conventional method, the gas is supplied from one end of the lower side or the upper side of the reaction tube 203, to a longitudinal arc-shaped space defined between the inner wall of the reaction tube 203 and ends of the plurality of stacked wafers 200, to allow a flow of the gas from the lower side to the upper side via the arc-shaped space or from the upper side to the lower side via the arc-shaped space, such that each wafer 200 stacked in the reaction tube 203 is reacted with the flowed gas. In this case, since an amount of the gas is relatively increased (a concentration of the gas is relatively high) in a portion near a gas supply part, a thickness of the thin film formed on the wafer 200 disposed at that portion is increased. Meanwhile, since the amount of the gas that can arrive at the wafers 200 is reduced (the concentration of the gas is relatively low) in a portion far from the gas supply part, a thickness of the thin film formed on the wafer 200 disposed at that portion is decreased. Accordingly, in this case, a difference in thickness of the thin films formed on the wafers 200 disposed at the upper portion and the lower portion occurs, and thus, the conventional method is inappropriate in the vertical batch-type apparatus for forming the thin films having a uniform thickness on the wafers 200.

Meanwhile, according to the gas supply method in this embodiment, the gas is transferred through the nozzles 249a, 249b, 249c and 249d disposed in the arc-shaped space and firstly injected into the reaction tube 203 near the wafers 200 through the gas supply holes 250a, 250b, 250c and 250d opened to the nozzles 249a, 249b, 249c and 249d, respectively, so that a main stream of the gas in the reaction tube 203 becomes parallel to the surfaces of the wafers 200, i.e., in a horizontal direction. According to the above configuration, the gas can be uniformly supplied to each wafer 200, and the thickness of the thin films formed on the wafers 200 can be uniformized. While a remaining gas after the reaction flows toward an exhaust port, that is, an exhaust pipe 231, which will be described later, a flow direction of the remaining gas is not limited to the vertical direction but may be appropriately determined according to a position of the exhaust port.

For example, silicon source gas, i.e., a gas containing silicon (Si) (silicon-containing gas), is supplied through the first gas supply pipe 232a into the process chamber 201 via the MFC 241a, the valve 243a and the first nozzle 249a. For example, dichlorosilane ($SiH_2Cl_2$, abbreviation: DCS) gas may be used as the silicon-containing gas.

For example, a gas containing carbon (C) (carbon-containing gas) is supplied through the second gas supply pipe 232b into the process chamber 201 via the MFC 241b, the valve 243b and the second nozzle 249b. For example, propylene ($C_3H_6$) gas may be used as the carbon-containing gas. In addition, a gas containing hydrogen (H) (hydrogen-containing gas) may be supplied through the second gas supply pipe 232b into the process chamber 201 via the MFC 241b, the valve 243b and the second nozzle 249b. For example, hydrogen ($H_2$) gas may be used as the hydrogen-containing gas.

For example, a gas containing boron (B) (boron-containing gas) is supplied through the third gas supply pipe 232c into the process chamber 201 via the MFC 241c, the valve 243c and the third nozzle 249c. For example, boron trichloride ($BCl_3$) gas may be used as the boron-containing gas. In addition, a gas containing oxygen (O) (oxygen-containing gas) may be supplied through the third gas supply pipe 232c into the process chamber 201 via the MFC 241c, the valve 243c and the third nozzle 249c. For example, oxygen ($O_2$) gas or nitrous oxide ($N_2O$) may be used as the oxygen-containing gas.

For example, a gas containing nitrogen (N) (nitrogen-containing gas) is supplied through the fourth gas supply pipe 232d into the process chamber 201 via the MFC 241d, the valve 243d and the fourth nozzle 249d. For example, ammonia ($NH_3$) gas may be used as the nitrogen-containing gas.

For example, nitrogen ($N_2$) gas is supplied into the process chamber 201 through the inert gas supply pipes 232e, 232f, 232g and 232h via the MFCs 241e, 241f, 241g and 241h, the valves 243e, 243f, 243g and 243h, and the gas supply pipes 232a, 232b, 232c and 232d, and the gas nozzles 249a, 249b, 249c and 249d.

For example, as described above, when the gases are supplied through the gas supply pipes, respectively, the first gas supply system constitutes a source gas supply system, i.e., a silicon-containing gas supply system (silane-based gas supply system). In addition, the second gas supply system constitutes a carbon-containing or hydrogen-containing gas supply system. In addition, the third gas supply system constitutes a boron-containing or oxygen-containing gas supply system. In addition, the fourth gas supply system constitutes a nitrogen-containing gas supply system.

The exhaust pipe 231 is installed at the reaction tube 203 to exhaust an atmosphere in the process chamber 201. As shown in FIG. 2, when seen from a horizontal cross-sectional view, the exhaust pipe 231 is installed at a side of the reaction tube 203 opposite to a side of the reaction tube 203 at which the gas supply hole 250a of the first nozzle 249a, the gas supply hole 250b of the second nozzle 249b, the gas supply hole 250c of the third nozzle 249c and the gas supply hole 250d of the fourth nozzle 249d are installed, i.e., an opposite side from the gas supply holes 250a, 250b, 250c and 250d with the wafers 200 interposed therebetween. In addition, as shown in FIG. 1, when seen from a vertical cross-sectional view, the exhaust pipe 231 is installed at a lower side of the reaction tube 203 than a place at which the gas supply holes 250a, 250b, 250c and 250d are installed. According to the above configuration, the gas supplied into a portion adjacent to the wafers 200 in the process chamber 201 through the gas supply holes 250a, 250b, 250c and 250d flows in a horizontal direction, i.e., a direction parallel to the surfaces of the wafers 200, and then flows downward to be exhausted through the exhaust pipe 231. In the process chamber 201, the fact that a main stream of the gas becomes a flow in the horizontal direction is as described above. A vacuum exhaust device such as a vacuum pump 246 is connected to the exhaust pipe 231 via a pressure detector (pressure detecting unit) such as a pressure sensor 245 configured to detect an internal pressure of the process chamber 201 and a pressure regulator (pressure regulating unit) such as an automatic pressure controller (APC) valve 244, so that the inside of the process chamber 201 can be vacuum-evacuated to a predetermined pressure (vacuum degree). The APC valve 244 is an on-off valve, which can be opened and closed to start and stop vacuum evacuation of the inside of the process chamber 201 and can be adjusted in degree of valve opening for pressure adjustment. Mainly, the exhaust pipe 231, the APC valve 244, the vacuum pump 246 and the pressure sensor 245 constitute an exhaust system.

A seal cap 219 is installed at the lower side of the reaction tube 203 as a furnace port cover that can hermetically close an opened bottom side of the reaction tube 203. The seal cap 219 is configured to make contact with the bottom side of the reaction tube 203 in a perpendicular direction from the lower side. For example, the seal cap 219 is made of a metal such as stainless steel and has a disk shape. An O-ring 220 is installed on the surface of the seal cap 219 as a seal member configured to make contact with the bottom side of the reaction tube 203. At a side of the seal cap 219 opposite to the process chamber 201, a rotary mechanism 267 is installed to rotate the boat 217. A rotation shaft 255 of the rotary mechanism 267 is connected to the boat 217, which will be described later, through the seal cap 219, to rotate the wafers 200 by rotating the boat 217. The seal cap 219 is configured to be vertically moved by an elevator such as a boat elevator 115 vertically installed outside the reaction tube 203, so that the boat 217 can be loaded into and unloaded from the process chamber 201.

The boat 217, which is a substrate support member, is made of a heat-resistant material such as quartz or silicon carbide and is configured to support the plurality of wafers 200 in a state in which the wafers 200 are horizontally oriented and concentrically arranged with each other in multiple stages. An insulating member 218 made of a heat-resistant material such as quartz or silicon carbide is installed at the lower part of the boat 217 to prevent heat transfer from the heater 207 to the seal cap 219. In addition, the insulating member 218 may include a plurality of insulating plates made of a heat-resistant material such as quartz or silicon carbide, and an insulating plate holder configured to support the insulating plates in a state in which the insulating plates are horizontally oriented and arranged in multiple stages.

A temperature sensor 263 is installed in the reaction tube 203 as a temperature detector, and by controlling power supplied to the heater 207 based on temperature information detected by the temperature sensor 263, desired temperature distribution in the process chamber 201 can be attained. Like the nozzles 249a, 249b, 249c and 249d, the temperature sensor 263 has an L-shape and is installed along the inner wall of the reaction tube 203.

A controller 121, which is a control part (control unit), is connected to devices such as the MFCs 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the boat rotary mechanism 267, the boat elevator 115, and so on. The controller 121 controls, for example, flow rates of various gases using the MFCs 241a, 241b, 241c, 241d, 241e, 241f, 241g and 241h, opening/closing operations of the valves 243a, 243b, 243c, 243d, 243e, 243f, 243g and 243h, opening/closing operations of the APC valve 244 and pressure adjusting operations of the APC valve 244 based on the pressure sensor 245, the temperature of the heater 207 based on the temperature sensor 263, starting/stopping operations of the vacuum pump 246, the rotation speed of the boat rotary mechanism 267, elevating operations of the boat elevator 115, and so on.

Next, three exemplary sequences (a first sequence, a second sequence, and a third sequence) for a step of forming an insulating film on a substrate, which is one of a plurality of processes for manufacturing a semiconductor device using the above-described process furnace of the substrate processing apparatus, will be described. In the following descriptions, operations of parts of the substrate processing apparatus are controlled by the controller 121.

As described above, while a high film-forming rate can be obtained through the conventional CVD method, it is difficult to satisfy requirements of the film-thinning due to further miniaturization. On the other hand, while the ALD method can satisfy the requirements of the film-thinning, it is difficult to realize the high film-forming rate. In the conventional CVD method, a plurality of kinds of gases containing a plurality of elements that constitute a film to be formed are simultaneously supplied. Meanwhile, in the ALD method, a plurality of kinds of gases containing a plurality of elements that constitute a film to be formed are alternately supplied. Then, a $SiO_2$ film or a $Si_3N_4$ film is formed by controlling supply conditions such as the flow rates of the supply gases, the supply times of the supply gases, and plasma power. In such a technique, for example, in the case of forming a $SiO_2$ film, supply conditions are controlled to adjust the composition ratio of the $SiO_2$ film to the stoichiometric composition of $O/Si \approx 2$, and in the case of forming a $Si_3N_4$ film, supply conditions are controlled to adjust the composition ratio of the $Si_3N_4$ film to the stoichiometric composition of $N/Si \approx 1.33$.

In the embodiment of the present invention, the supply conditions are controlled to improve the defects of the conventional CVD and ALD methods, satisfy the requirements of the film-thinning, and realize the high film-forming rate. In addition, the supply conditions are controlled so that the composition ratio of a film to be formed can become the stoichiometric composition or a composition ratio different from the stoichiometric composition. Hereinafter, in addition to realization of the high film-forming rate and the film-thinning, exemplary sequences for a step of forming a film while controlling the ratio of a plurality of elements constituting the film, i.e., the composition ratio of the film, will be explained.

(First Sequence)

First, a first sequence will now be described according to the embodiment.

Figure 3:
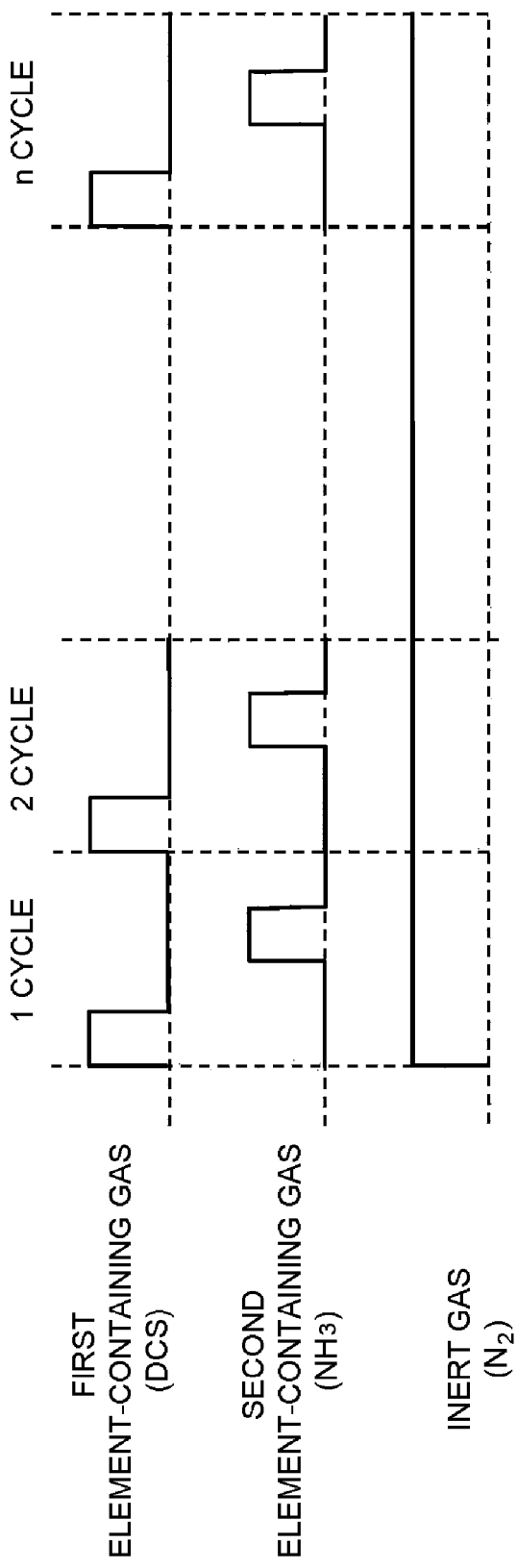
FIG. 3 is a view illustrating gas supply timing in a first sequence according to an embodiment of the present invention.
Figure 6:
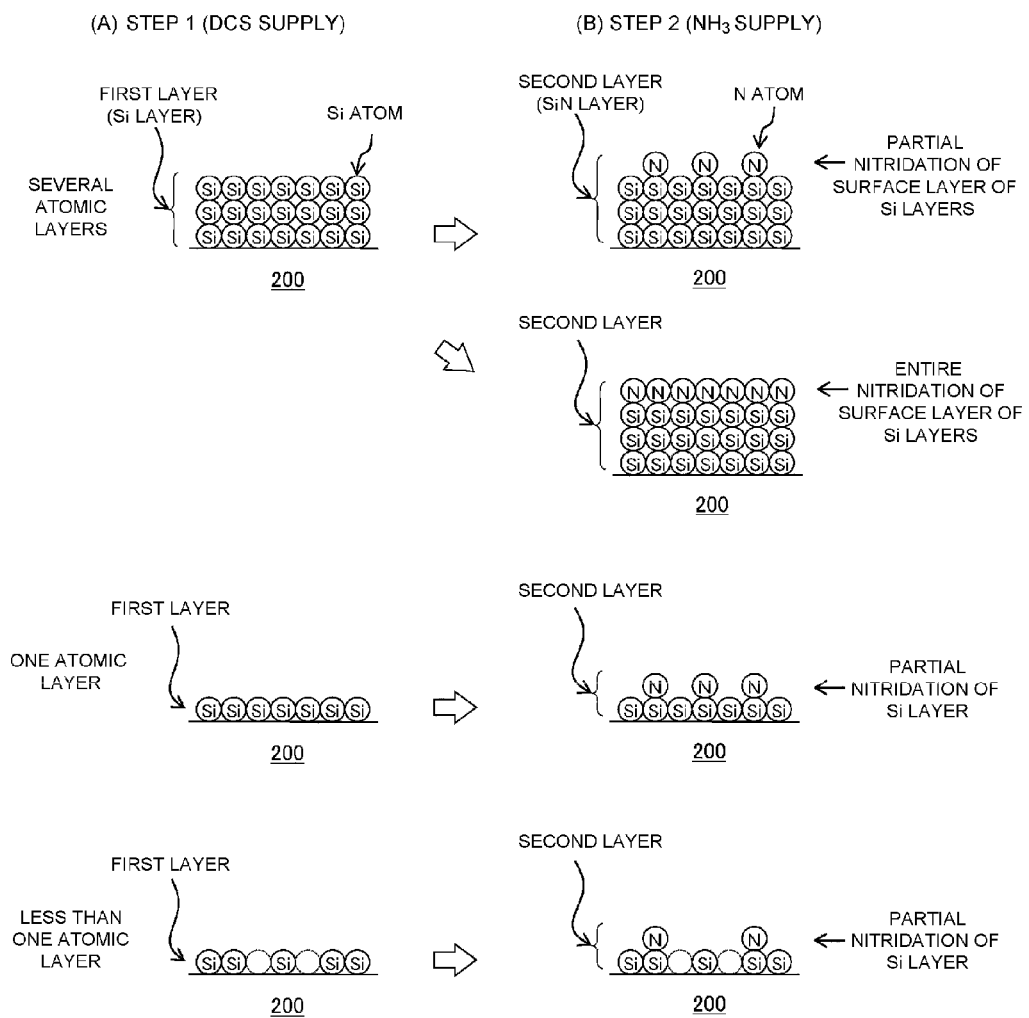
FIG. 6 is a schematic view illustrating formation of a silicon nitride film on a wafer according to the first sequence of the embodiment of the present invention.
Figure 7:
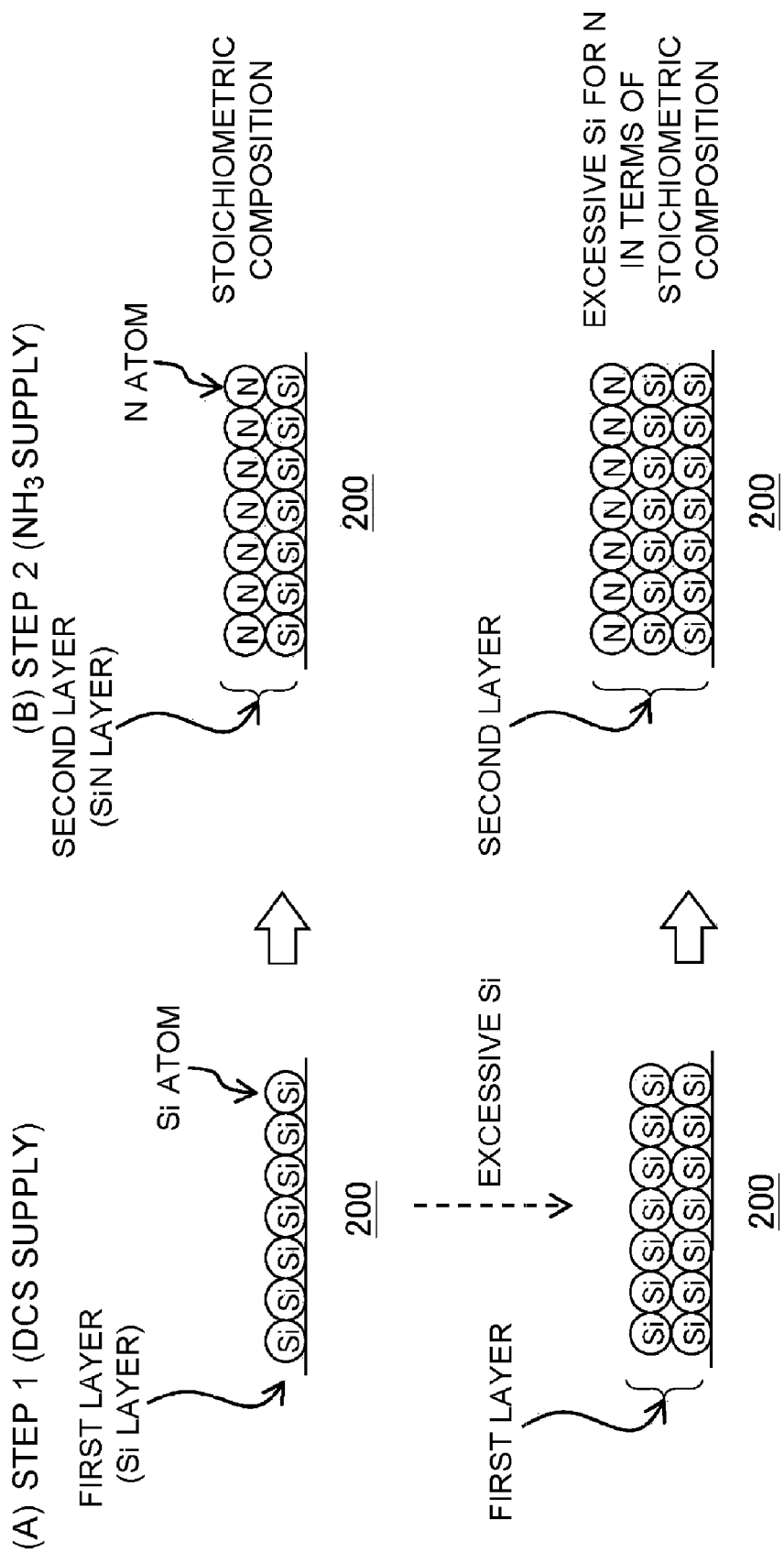
FIG. 7 is a schematic view illustrating a case where silicon is excessively supplied in Step 1 of the first sequence according to the embodiment of the present invention.
Figure 8:
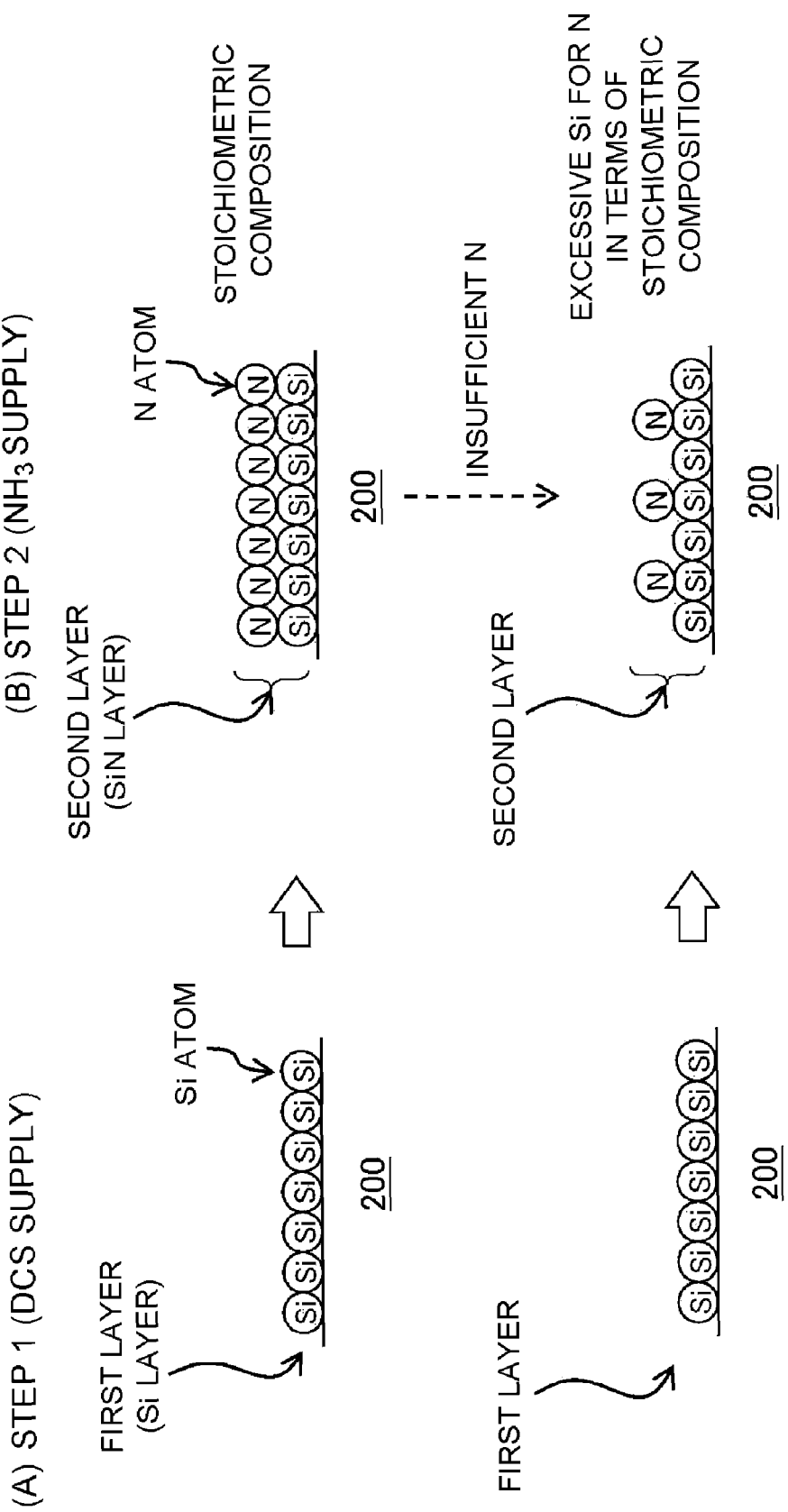
FIG. 8 is a schematic view illustrating a case where nitrogen is insufficiently supplied in Step 2 of the first sequence according to the embodiment of the present invention.

FIG. 3 is a view illustrating gas supply timing in the first sequence of the embodiment; FIG. 6 is a schematic view illustrating formation of a silicon nitride film on a wafer according to the first sequence of the embodiment; FIG. 7 is a schematic view illustrating a case where silicon is excessively supplied in Step 1 of the first sequence according to the embodiment; and FIG. 8 is a schematic view illustrating a case where nitrogen is insufficiently supplied in Step 2 of the first sequence according to the embodiment. The first sequence of the embodiment relates to control of a two-element-based composition ratio.

The first sequence of the embodiment includes steps of: forming a first layer including a first element being able to become solid state by itself on a wafer 200 by supplying a gas containing the first element (a first element-containing gas) into a process vessel in which the wafer 200 is accommodated under a condition that a chemical vapor deposition (CVD) reaction occurs; and forming a second layer including the first element and a second element being unable to become solid state by itself by supplying a gas containing the second element (a second element-containing gas) into the process vessel to modify the first layer, wherein a cycle including the steps of forming the first layer and forming the second layer is performed at least once to form a thin film including the first and second elements and having a predetermined thickness.

The step of forming the first layer is performed under a condition that a CVD reaction occurs. Here, a first element layer including the first element and having less than one atomic layer to several atomic layers is formed on the wafer 200 as the first layer. An element being able to become solid state by itself may be used as the first element. Here, "being able to become solid state by itself" means that a bonding force between the same atoms is stronger than thermal vibration (lattice vibration), and the atoms are densely filled to reach a crystalline state or an amorphous state. In the case of silicon atoms, the solid state means states of single crystalline silicon, polycrystalline silicon (polysilicon), or amorphous silicon. In addition, "forming the first layer including a first element being able to become solid state by itself on a wafer 200 by supplying a gas containing the first element (a first element-containing gas) into a process vessel in which the wafer 200 is accommodated under the condition that the CVD reaction occurs" includes supplying the gas containing the first element in an atmosphere in the process vessel, in which each element of the gas containing the first element is pyrolyzed, and depositing the first layer including the pyrolyzed first element on the surface of the substrate in a crystalline state or an amorphous state. The first element layer is a general term for a layer made of the first element, such as a continuous layer, a discontinuous layer, and a thin film in which such layers are overlapped. In addition, a continuous layer formed of the first element may also be called "a thin film." "A layer less than one atomic layer" is used to denote a discontinuous atomic layer. Here, under a condition that the first element-containing gas is not self-decomposed, a first element-containing gas adsorption layer is formed by adsorption of the first element-containing gas on the wafer 200. On the other hand, under a condition that the CVD reaction occurs like the embodiment, i.e., under a condition that the first element-containing gas is self-decomposed, the first element-containing gas is pyrolyzed, the first element is deposited on the wafer 200, and as a result, the first element layer, which is a deposition layer of the first element, is formed. In comparison with the case that the adsorption layer of the first element-containing gas is formed on the wafer 200, it may be preferable to form the deposition layer of the first element on the wafer 200 as in this embodiment, due to an increased film-forming rate.

In the step of forming the second layer, the second element-containing gas is activated by heat and supplied to the first layer to cause a part of the first layer to react with the second element-containing gas, modifying the first layer and thus forming the second layer including the first and second elements. For example, when the first layer including the first element and having several atomic layers is formed in the step of forming the first layer, a surface layer of the several atomic layers may be partially or entirely caused to react with the second element-containing gas. Alternatively, the surface layer and the next lower layers among the several atomic layers of the first layer including the first element may be caused to react with the second element-containing gas. However, when the first layer is constituted by the several atomic layers including the first element, it may be preferable to modify only the surface layer because the composition ratio of the thin film can be controlled more easily. Preferably, an element being unable to become solid state by itself may be used as the second element. When the second element-containing gas is supplied after being activated by heat, rather than activated by plasma, a soft reaction can be generated, and soft modification can be performed. Accordingly, in this embodiment, the second element-containing gas is supplied after being activated by heat.

In the first sequence of the embodiment, the supply conditions are controlled such that the composition ratio of the thin film is the stoichiometric composition or a predetermined composition ratio different from the stoichiometric composition. For example, when the composition ratio of the thin film is controlled to a predetermined composition ratio different from the stoichiometric composition, in the step of forming any one layer of the first and second layers, the internal pressure of the process vessel or the internal pressure and the gas supply time are controlled to be higher or longer than the internal pressure of the process vessel or the internal pressure and the gas supply time in a step of forming one layer when the thin film having the stoichiometric composition is formed.

Alternatively, in a step of forming another layer of the first and second layers, the internal pressure of the process vessel or the internal pressure and the gas supply time are controlled to be lower or shorter than the internal pressure of the process vessel or the internal pressure and the gas supply time in the step of forming another layer when the thin film having the stoichiometric composition is formed.

Therefore, the thin film having a composition in which one element is excessive in comparison with the other element in terms of the stoichiometric composition is formed.

For example, when the composition ratio of the thin film is controlled such that the first element is excessive in comparison with the second element in terms of the stoichiometric composition, the internal pressure of the process vessel or the internal pressure and the gas supply time in the step of forming the first layer are controlled to be higher or longer than the internal pressure of the process vessel or the internal pressure and the gas supply time in the step of forming the first layer when the thin film having the stoichiometric composition is formed. By controlling the process conditions in this way, in comparison with the case where the thin film is formed to have the stoichiometric composition, the first element may be excessively supplied in the step of forming the first layer. And, due to the excessive supply of the first element in the step of forming the first layer, the modification reaction of the first layer is not saturated in the step of forming the second layer. That is, in comparison with the case where the thin film is formed to have the stoichiometric composition, an excessive number of atoms of the first element are supplied in the step of forming the first layer, and thus, in the step of forming the second layer, the modification reaction of the first layer is suppressed.

Alternatively, the internal pressure of the process vessel or the internal pressure and the gas supply time in the step of forming the second layer are controlled to be lower or shorter than the internal pressure of the process vessel or the internal pressure and the gas supply time in the step of forming the second layer when the thin film having the stoichiometric composition is formed. By controlling the process conditions in this way, in comparison with the case where the thin film is formed to have the stoichiometric composition, the second element is insufficiently supplied in the step of forming the second layer. And, due to the insufficient supply of the second element in the step of forming the second layer, the modification reaction of the first layer is not saturated in the step of forming the second layer. That is, in comparison with the case where the thin film is formed to have the stoichiometric composition, an insufficient number of atoms of the second element are supplied in the step of forming the second layer, and thus, in the step of forming the second layer, the modification reaction of the first layer is suppressed.

For example, like the O/Si ratio of a $SiO_2$ film or the N/Si ratio of a $Si_3N_4$ film, when the portion of O or N being the second element is relatively great in the saturated bonding ratio, as described above, it is controlled such that the modification reaction is not saturated in the step of forming the second layer.

Meanwhile, in the first sequence of the embodiment, the thin film having the stoichiometric composition may also be formed.

Hereinafter, the first sequence of the embodiment will be explained more specifically. In the following description, an explanation will be given of an example where a silicon nitride (SiN) film is formed on a substrate as an insulating film according to the sequence shown in FIG. 3 under the conditions that silicon (Si) is the first element, nitrogen (N) is the second element, DCS gas, which is a silicon-containing gas, is used as the first element-containing gas, and $NH_3$ gas, which is a nitrogen-containing gas, is used as the second element-containing gas. Furthermore, in the following description of the example, the composition ratio of the silicon nitride film is controlled such that silicon (Si) is excessive in comparison with nitrogen (N) in terms of the stoichiometric composition. In the example, the first gas supply system constitutes a silicon-containing gas supply system (a first element-containing gas supply system), and the fourth gas supply system constitutes a nitrogen-containing gas supply system (a second element-containing gas supply system).

When the plurality of wafers 200 are charged into the boat 217 (wafer charging), as shown in FIG. 1, the boat 217 in which the plurality of wafers 200 are supported is lifted and loaded into the process chamber 201 by the boat elevator 115 (boat loading). In this state, the bottom side of the reaction tube 203 is sealed by the seal cap 219 via the O-ring 220 interposed therebetween.

The inside of the process chamber 201 is vacuum-evacuated to a desired pressure (vacuum degree) using the vacuum pump 246. At this time, the internal pressure of the process chamber 201 is measured by the pressure sensor 245, and based on the measured pressure, the APC valve 244 is feedback-controlled (pressure adjustment). In addition, the inside of the process chamber 201 is heated to a desired temperature using the heater 207. At this time, to obtain desired temperature distribution in the process chamber 201, power to the heater 207 is feedback-controlled based on temperature information measured by the temperature sensor 263 (temperature adjustment). Next, the boat 217 is rotated by the rotary mechanism 267 to rotate the wafers 200 (wafer rotation). Thereafter, the following two steps are sequentially performed.

[Step 1]

The valve 243a of the first gas supply pipe 232a is opened to allow a flow of DCS gas into the first gas supply pipe 232a. The flow rate of the DCS gas flowing through the first gas supply pipe 232a is controlled by the MFC 241a. Then, the DCS gas whose flow rate is controlled is supplied into the process chamber 201 through the gas supply holes 250a of the first nozzle 249a, horizontally flows on the surfaces of the wafers 200, and is exhausted through the exhaust pipe 231. At this time, the valve 243e is also opened so that an inert gas such as $N_2$ gas can flow through the inert gas supply pipe 232e. The flow rate of the $N_2$ gas flowing through the inert gas supply pipe 232e is controlled by the MFC 241e. Then, together with the DCS gas, the $N_2$ gas whose flow rate is controlled is supplied into the process chamber 201, horizontally flows on the surfaces of the wafers 200, and is exhausted through the exhaust pipe 231. At this time, a main flow of the gas in the process chamber 201 is in a horizontal direction, i.e., parallel to the surfaces of the wafers 200.

At this time, the APC valve 244 is properly controlled to keep the internal pressure of the process chamber 201, for example, in a range of 10 Pa to 1000 Pa. The flow rate of the DCS gas controlled by the MFC 241a is, for example, in the range of 10 sccm to 1000 sccm. The time during exposure of the wafers 200 to the DCS gas, i.e., gas supply time (exposure time), is in a range of, for example, 1 second to 120 seconds. At this time, the temperature of the heater 207 is set to a predetermined temperature such that a CVD reaction can occur in the process chamber 201. That is, the temperature of the heater 207 is set such that the temperature of the wafers 200 can be in a range of, for example, 350° C. to 700° C. Here, when the temperature of the wafers 200 is lower than 350° C., pyrolysis of the silicon-containing gas such as DCS is difficult. On the other hand, when the temperature of the wafers 200 is higher than 700° C., uniformity can be easily deteriorated due to a strong CVD reaction. Therefore, it is preferable for the wafers 200 to be kept in the temperature range of 350° C. to 700° C.

By the supply of the DCS gas, the first layer including silicon as the first element is formed on an under-layer film of each of the wafers 200. That is, as shown in FIG. 6A, a silicon layer (Si layer) is formed on the wafer 200 (on the under-layer film) as a silicon-containing layer having less than one atomic layer to several atomic layers. Silicon is an element being able to become solid state by itself. Here, upper, middle and lower parts of FIG. 6A show examples of silicon layers of several atomic layers, one atomic layer, and less than one atomic layer respectively. Here, the silicon layer is a general term for a layer made of silicon, such as a continuous layer, a discontinuous layer, and a thin film in which such layers are overlapped. A continuous layer formed of silicon may also be called "a thin film." When the thickness of the silicon layer formed on the wafer 200 is greater than the thickness of several atomic layers, a nitridation effect in Step 2, which will be described later, can not reach all over the silicon layer.

Meanwhile, the minimum of the silicon layer that can be formed on the wafer 200 is less than one atomic layer. Therefore, preferably, the thickness of the silicon layer may range from the thickness of less than one atomic layer to the thickness of several atomic layers. Under a condition that the DCS gas is not self-decomposed, while a DCS chemical adsorption layer is formed by chemical adsorption of DCS on the wafer 200, under a condition that the CVD reaction occurs as in this embodiment, i.e., that the DCS gas is self-decomposed, due to pyrolysis of the DCS gas, the silicon layer is formed on the wafer 200 by deposition of silicon on the wafer 200. In comparison with the case where the DCS chemical adsorption layer is formed on the wafer 200, the film forming rate can be higher in the case where the silicon layer is formed on the wafer 200 as in this embodiment.

After the silicon layer is formed, the valve 243a is closed to interrupt the supply of DCS gas. At this time, in a state in which the APC valve 244 of the exhaust pipe 231 is opened, the inside of the process chamber 201 is vacuum-evacuated using the vacuum pump 246 so that the DCS gas remaining in the process chamber 201 without participating in a reaction or after participating in the formation of the silicon layer can be removed from the process chamber 201. Furthermore, at this time, in a state in which the valve 243e is opened, supply of $N_2$ gas into the process chamber 201 is continued. Due to this, the DCS gas remaining in the process chamber 201 without participating in a reaction or after participating in the formation of the silicon layer can be removed from the process chamber 201 more effectively. On the other hand, at this time, the gas remaining in the process chamber 201 may not be completely removed therefrom, that is, the inside of the process chamber 201 may not be completely purged. When a small amount of gas remains in the process chamber 201, there is no ill effect due to the remaining gas in Step 2 to be performed thereafter. At this time, there is no need to supply a large amount of $N_2$ gas into the process chamber 201. For example, a flow rate of the $N_2$ gas supplied into the process chamber 201 may be controlled to supply the same amount of gas as a capacity of the reaction tube 203 (the process chamber 201), so that the purge can be performed with no ill effect in Step 2. As described above, since the inside of the process chamber 201 is not completely purged, a purge time can be reduced and throughput can be improved. In addition, consumption of the $N_2$ gas can be maximally suppressed.

Instead of DCS gas, another gas can be alternatively used as the silicon-containing gas. Examples of such alternative gases include: an inorganic source gas such as tetrachlorosilane ($SiCl_4$, abbreviation: TCS) gas, hexachlorodisilane ($Si_2Cl_6$, abbreviation: HCD) gas, and monosilane ($SiH_4$) gas; and an organic source gas such as an aminosilane-based gas such as tetrakisdimethylaminosilane ($Si(N(CH_3)_2)_4$, abbreviation: 4DMAS) gas, trisdimethylaminosilane ($Si(N(CH_3)_2)_3H$, abbreviation: 3DMAS) gas, bisdiethylaminosilane ($Si(N(C_2H_5)_2)_2H_2$, abbreviation: 2DEAS) gas, and bis-tertiarybutylaminosilane ($SiH_2(NH(C_4H_9))_2$, abbreviation: BTBAS) gas. Instead of $N_2$ gas, a rare gas such as Ar gas, He gas, Ne gas, and Xe gas may be used as the inert gas.

[Step 2]

After removing gas remaining in the process chamber 201, the valve 243d of the fourth gas supply pipe 232d is opened to allow a flow of $NH_3$ gas through the fourth gas supply pipe 232d. The flow rate of the $NH_3$ gas flowing through the fourth gas supply pipe 232d is controlled by the MFC 241d. Then, the $NH_3$ gas whose flow rate is controlled is supplied into the process chamber 201 through the gas supply holes 250d of the fourth nozzle 249d, horizontally flows on the surfaces of the wafers 200, and is exhausted through the gas exhaust pipe 231. At this time, the valve 243h is also opened to allow a flow of $N_2$ gas through the inert gas supply pipe 232h. Then, together with the $NH_3$ gas, the $N_2$ gas is supplied into the process chamber 201, horizontally flows on the surfaces of the wafers 200, and is exhausted through the exhaust pipe 231. Here, a main flow of the gas in the process chamber 201 is in a horizontal direction, i.e., parallel to the surfaces of the wafers 200.

At this time, the APC valve 244 is properly controlled to adjust the internal pressure of the process chamber 201, for example, in a range of 50 Pa to 3000 Pa. The flow rate of the $NH_3$ gas controlled by the MFC 241d is, for example, in a range of 100 sccm to 10000 sccm. The time during exposure of the wafers 200 to the $NH_3$ gas, i.e., gas supply time (exposure time), is in a range of, for example, 1 second to 120 seconds. At this time, like in Step 1, the temperature of the heater 207 is set to a predetermined temperature so that the temperature of the wafers 200 can be in a range of, for example, 350° C. to 700° C. Since the $NH_3$ gas has a high reaction temperature and cannot easily react at the above-mentioned temperature range of the wafers 200, the internal pressure of the process chamber 201 is set to a relatively high pressure as described above to enable thermal activation thereof. Since the $NH_3$ gas is supplied after activating the $NH_3$ gas by heat (non-plasma state), a soft reaction can be caused, and soft nitridation, which will be described later, can be performed.

At this time, a gas flowing in the process chamber 201 is the thermally-activated $NH_3$ gas, and the DCS gas does not flow in the process chamber 201. Therefore, the $NH_3$ gas does not cause a vapor-phase reaction, but the activated $NH_3$ gas is brought into a reaction with a part of the silicon layer formed on the wafers 200 as the first layer in Step 1. As a result, the silicon layer is nitrided and modified into a second layer including silicon (a first element) and nitrogen (a second element), i.e., into a silicon nitride (SiN) layer.

At this time, as shown in FIG. 6B, a nitridation reaction of the silicon layer is not saturated. For example, when a silicon layer including several atomic layers is formed in Step 1, at least a part of the surface layer (the surface atomic layer) of the atomic layers is nitrided. That is, the surface layer is partially or entirely nitrided. In this case, so as not to entirely nitride the silicon layer including several atomic layers, the silicon layer is nitrided under a non-saturated condition. Alternatively, according to conditions, while the surface layer and the next lower layers among the several atomic layers of the silicon layer can be nitrided, the case where only the surface layer is nitrided is preferable because the composition ratio of the silicon nitride film can be controlled more easily. In addition, for example, when a silicon layer including one atomic layer or less than one atomic layer is formed in Step 1, a part of the silicon layer is nitrided. In this case, like in the above, so as not to entirely nitride the silicon layer including one atomic layer or less than one atomic layer, the silicon layer is nitrided under a non-saturated condition. Here, nitrogen is an element being unable to become solid state by itself.

Thereafter, the valve 243d of the fourth gas supply pipe 232d is closed to interrupt the supply of $NH_3$ gas. At this time, in a state in which the APC valve 244 of the exhaust pipe 231 is opened, the inside of the process chamber 201 is vacuum-evacuated using the vacuum pump 246 so that the $NH_3$ gas remaining in the process chamber 201 without participating in the nitridation reaction or after participating in the nitridation reaction can be removed from the process chamber 201. Furthermore, at this time, in a state in which the valve 243h is opened, supply of the $N_2$ gas into the process chamber 201 is continued. Due to this, the $NH_3$ gas remaining in the process chamber 201 without participating in the nitridation reaction or after participating in the nitridation reaction can be removed from the process chamber 201 more effectively. Meanwhile, at this time, the gas remaining in the process chamber 201 may not be completely removed therefrom, that is, the inside of the process chamber 201 may not be completely purged. When a small amount of gas remains in the process chamber 201, there is no ill effect in Step 1 to be performed thereafter. At this time, there is no need to supply a large amount of $N_2$ gas into the process chamber 201. For example, a flow rate of the $N_2$ gas supplied into the process chamber 201 may be controlled to supply the same amount of gas as the capacity of the reaction tube 203 (the process chamber 201), so that the purge can be performed with no ill effect in Step 1. As described above, since the inside of the process chamber 201 is not completely purged, the purge time can be reduced and throughput can be improved. In addition, consumption of the $N_2$ gas can be maximally suppressed.

As a nitrogen-containing gas, not only $NH_3$ gas but also another gas such as nitrogen ($N_2$) gas, nitrogen trifluoride ($NF_3$) gas, hydrazine ($N_2H_4$) gas, $N_3H_8$ gas, and so on, may be used.

By setting the above-described Step 1 and Step 2 to one cycle and performing this cycle at least once, a thin film including silicon (a first element) and nitrogen (a second element), i.e., a silicon nitride (SiN) film, can be formed on each of the wafers 200 to a predetermined thickness. Preferably, the cycle may be repeated a plurality of times.

In Step 1, the internal pressure of the process chamber 201, or the internal pressure of the process chamber 201 and the gas supply time are controlled to be higher or longer than the internal pressure of the process chamber 201, or the internal pressure of the process chamber 201 and the gas supply time in Step 1 when the silicon nitride film having a stoichiometric composition is formed. By controlling the process conditions in this way, in comparison with the case where the silicon nitride film is formed to have the stoichiometric composition, silicon can be excessively supplied in Step 1 (refer to FIG. 7A). Therefore, due to the excessive supply of silicon in Step 1, the nitridation reaction of the silicon layer is not saturated in Step 2 (refer to FIG. 7B). That is, in comparison with the case where the silicon nitride film is formed to have the stoichiometric composition, an excessive number of silicon atoms are supplied in Step 1, and thus, in Step 2, the nitridation reaction of the silicon layer is suppressed. Accordingly, the composition ratio of the silicon nitride (SiN) film is controlled such that silicon (Si) is excessive in comparison with nitrogen (N) in terms of the stoichiometric composition.

In the upper side of FIG. 7, schematic partial section views of a wafer are shown to explain reaction states in steps during formation of a SiN film having a stoichiometric composition. In the lower side of FIG. 7, schematic partial section views of a wafer are shown to explain reaction states in steps during formation of SiN film having excessive silicon (Si) in comparison with nitrogen (N) in terms of the stoichiometric composition by excessively supplying silicon (Si). FIGS. 7A and 7B illustrate reaction states in Step 1 and Step 2, respectively. The upper side of FIG. 7 shows an exemplary case where a continuous Si layer constituted by one atomic layer is formed in Step 1 and the Si layer is entirely nitrided in Step 2, and the lower side of FIG. 7 shows an exemplary case where a continuous Si layers constituted by two atomic layers is formed in Step 1 and the surface layer of the Si layers is nitrided in Step 2.

Alternatively, in Step 2, the internal pressure of the process chamber 201, or the internal pressure of the process chamber 201 and the gas supply time are controlled to be lower or shorter than the internal pressure of the process chamber 201, or the internal pressure of the process chamber 201 and the gas supply time in Step 2 when the silicon nitride having the stoichiometric composition is formed. By controlling the process conditions in this way, in comparison with the case where the silicon nitride film is formed to have the stoichiometric composition, nitrogen can be insufficiently supplied in Step 2 (refer to FIG. 8B). Therefore, due to the insufficient supply of nitrogen in Step 2, the nitridation reaction of the silicon layer is not saturated in Step 2. That is, in comparison with the case where the silicon nitride film is formed to have the stoichiometric composition, an insufficient number of nitrogen atoms are supplied in Step 2, and thus, in Step 2, the nitridation reaction of the silicon layer is suppressed. Accordingly, the composition ratio of the silicon nitride (SiN) film can be controlled such that silicon (Si) is excessive in comparison with nitrogen (N) in terms of the stoichiometric composition.

In the upper side of FIG. 8, schematic partial section views of a wafer are shown to explain reaction states in steps during formation of a SiN film having a stoichiometric composition. In the lower side of FIG. 8, schematic partial section views of a wafer are shown to explain reaction states in steps during formation of a SiN film having excessive silicon (Si) in comparison with nitrogen (N) in terms of the stoichiometric composition by insufficiently supplying nitrogen (N). FIGS. 8A and 8B illustrate reaction states in Step 1 and Step 2, respectively. The upper side of FIG. 8 shows an exemplary case where a continuous Si layer constituted by one atomic layer is formed in Step 1 and the Si layer is entirely nitrided in Step 2, and the lower side of FIG. 8 shows an exemplary case where a continuous Si layer constituted by one atomic layer is formed in Step 1 and the surface layer of the Si layer is partially nitrided in Step 2.

As described above, in the first sequence of the embodiment, the internal pressure of the process chamber 201 or the internal pressure of the process chamber 201 and the gas supply time are controlled in Steps 1 and 2 to control a balance between the supply amount (deposition amount) of silicon in Step 1 and the supply amount (reaction amount) of nitrogen in Step 2, thereby controlling the composition ratio of the SiN film to be formed. Meanwhile, in the first sequence of the embodiment, by controlling the balance between the supply amount (deposition amount) of the silicon in Step 1 and supply amount (reaction amount) of the nitrogen in Step 2, the SiN film having the stoichiometric composition can also be formed. In this case, control of the balance between the supply amount (deposition amount) of the silicon in Step 1 and supply amount (reaction amount) of the nitrogen in Step 2 is performed by controlling the internal pressure of the process chamber 201 or the internal pressure of the process chamber 201 and the gas supply time in Steps 1 and 2.

After a silicon nitride film having a predetermined composition and thickness is formed in the film-forming process, an inert gas such as $N_2$ gas is supplied into the process chamber 201 and is exhausted from the process chamber 201 to purge the inside of the process chamber 201 (gas purge). Then, the atmosphere in the process chamber 201 is replaced with an inert gas (replacement with an inert gas), and the inside of the process chamber 201 returns to a normal pressure (return to the atmospheric pressure).

Thereafter, the seal cap 219 is moved downward by the boat elevator 115 to open the bottom side of the reaction tube 203 and unload the boat 217 in which the processed wafers 200 are supported from the bottom side of the reaction tube 203 to the outside of the reaction tube 203 (boat unloading). Thereafter, the processed wafers 200 are discharged from the boat 217 (wafer discharging).

In the above-described example of the first sequence of the embodiment, while a silicon-containing gas and a nitrogen-containing gas are respectively used as a first element-containing gas and a second element-containing gas to form a SiN film, the present invention is not limited to the example but various changes and modifications may be made without departing from the scope of the present invention.

For example, an aluminum-containing gas and a nitrogen-containing gas may be used as a first element-containing gas and a second element-containing gas, respectively, to form an aluminum nitride (AlN) film; a titanium-containing gas and a nitrogen-containing gas may be used as a first element-containing gas and a second element-containing gas, respectively, to form a titanium nitride (TiN) film; a tantalum-containing gas and a nitrogen-containing gas may be used as a first element-containing gas and a second element-containing gas, respectively, to form a tantalum nitride (TaN) film; or a boron-containing gas and a nitrogen-containing gas may be used as a first element-containing gas and a second element-containing gas, respectively, to form a boron nitride (BN) film. In addition, for example, a silicon-containing gas and an oxygen-containing gas may be used as a first element-containing gas and a second element-containing gas, respectively, to form a silicon oxide (SiO) film; an aluminum-containing gas and an oxygen-containing gas may be used as a first element-containing gas and a second element-containing gas, respectively, to form an aluminum oxide (AlO) film; or a titanium-containing gas and an oxygen-containing gas may be used as a first element-containing gas and a second element-containing gas, respectively, to form a titanium oxide (TiO) film. Furthermore, a silicon-containing gas and a carbon-containing gas may be used as a first element-containing gas and a second element-containing gas, respectively, to form a silicon carbide (SiC) film.

As an aluminum-containing gas, for example, trimethylaluminum ($Al(CH_3)_3$, abbreviation: TMA) gas may be used. As a titanium-containing gas, for example, titanium tetrachloride ($TiCl_4$) gas or tetrakis(dimethylamido)titanium ($Ti[N(CH_3)_2]_4$, abbreviation: TDMAT) gas may be used. As a tantalum-containing gas, for example, tantalum pentachloride ($TaCl_5$) gas or pentaethoxy tantalum ($Ta(OC_2H_5)_5$, abbreviation: PET) gas may be used. As a boron-containing gas, for example, boron trichloride ($BCl_3$) gas or diborane ($B_2H_6$) gas may be used. As a carbon-containing gas, for example, propylene ($C_3H_6$) gas or ethylene ($C_2H_4$) gas may be used. As an oxygen-containing gas, for example, oxygen ($O_2$) gas, ozone ($O_3$) gas, nitric oxide (NO) gas, nitrous oxide ($N_2O$) gas, or vapor ($H_2O$) may be used.

When an oxygen-containing gas is used as a second element-containing gas, a hydrogen-containing gas may be supplied together with the oxygen-containing gas. When an oxygen-containing gas and a hydrogen-containing gas are supplied into a process vessel kept at a pressure lower than the atmospheric pressure (decompressed state), the oxygen-containing gas and the hydrogen-containing gas react with each other in the process vessel to produce an oxidizing species containing oxygen (such as atomic oxygen) so that a first layer can be oxidized by the oxidizing species. In this case, oxidation can be performed with increased oxidizing power in comparison with the case of using an oxygen-containing gas solely. This oxidizing treatment is performed under a decompressed atmosphere in non-plasma state. As the hydrogen-containing gas, for example, hydrogen ($H_2$) gas may be used.

As described above, according to the first sequence of the embodiment, a semiconductor element such as silicon (Si) or boron (B), or a metal element such as aluminum (Al) or titanium (Ti) may be used as a first element, and an element such as nitrogen (N), carbon (C), or oxygen (O) may be used as a second element.

(Second Sequence)

Next, a second sequence according to the embodiment will now be described.

Figure 4:
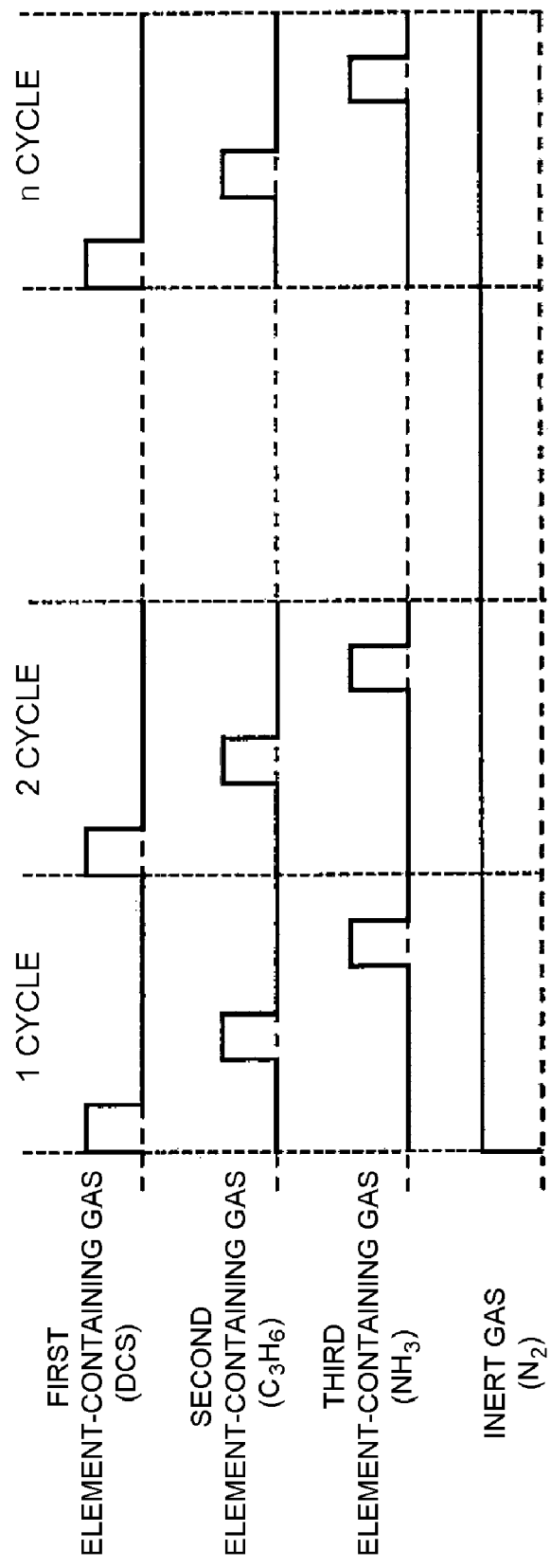
FIG. 4 is a view illustrating gas supply timing in a second sequence according to an embodiment of the present invention.
Figure 9:
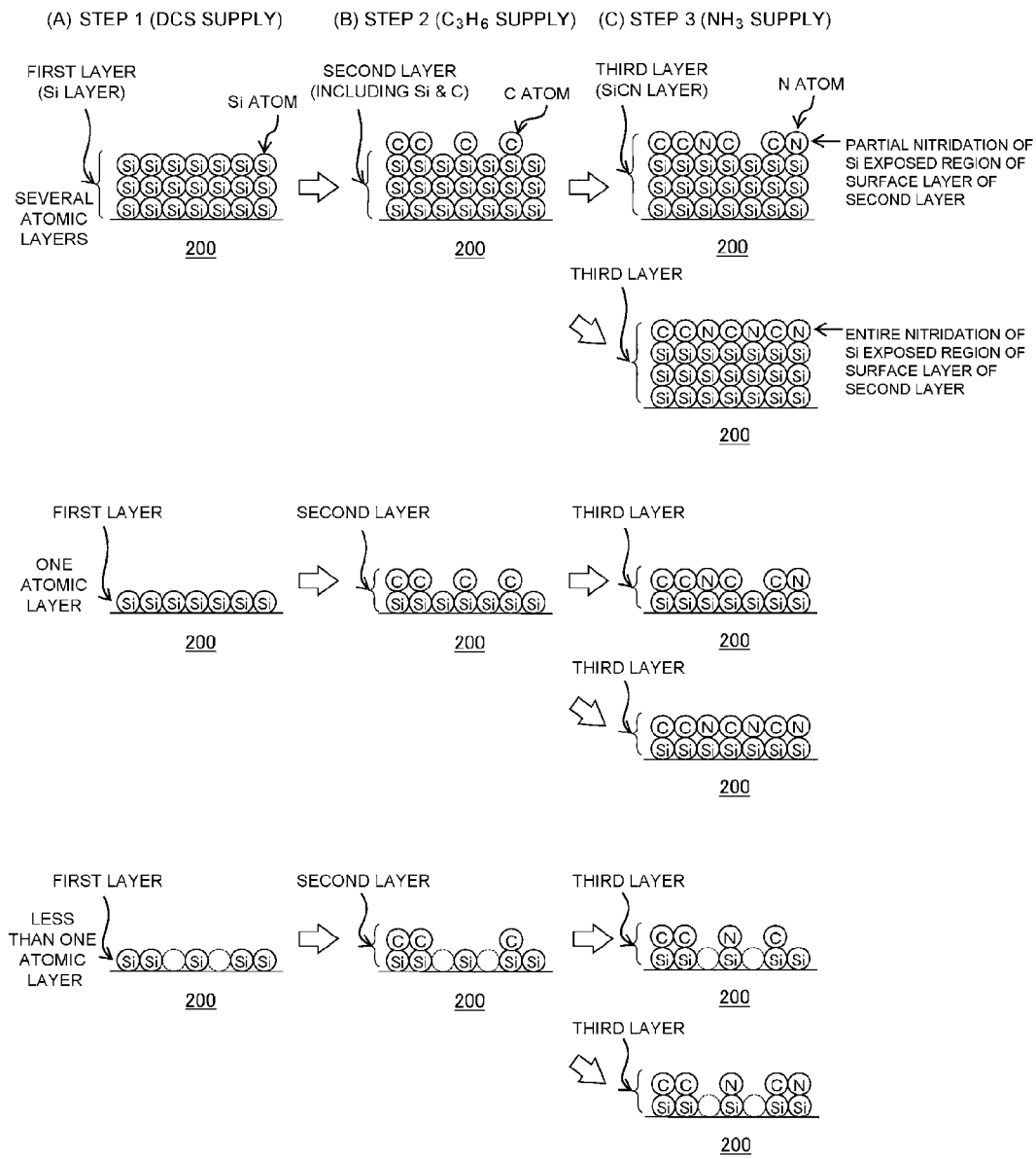
FIG. 9 is a schematic view illustrating formation of a silicon carbonitride film on a wafer according to the second sequence of the embodiment of the present invention.
Figure 10:
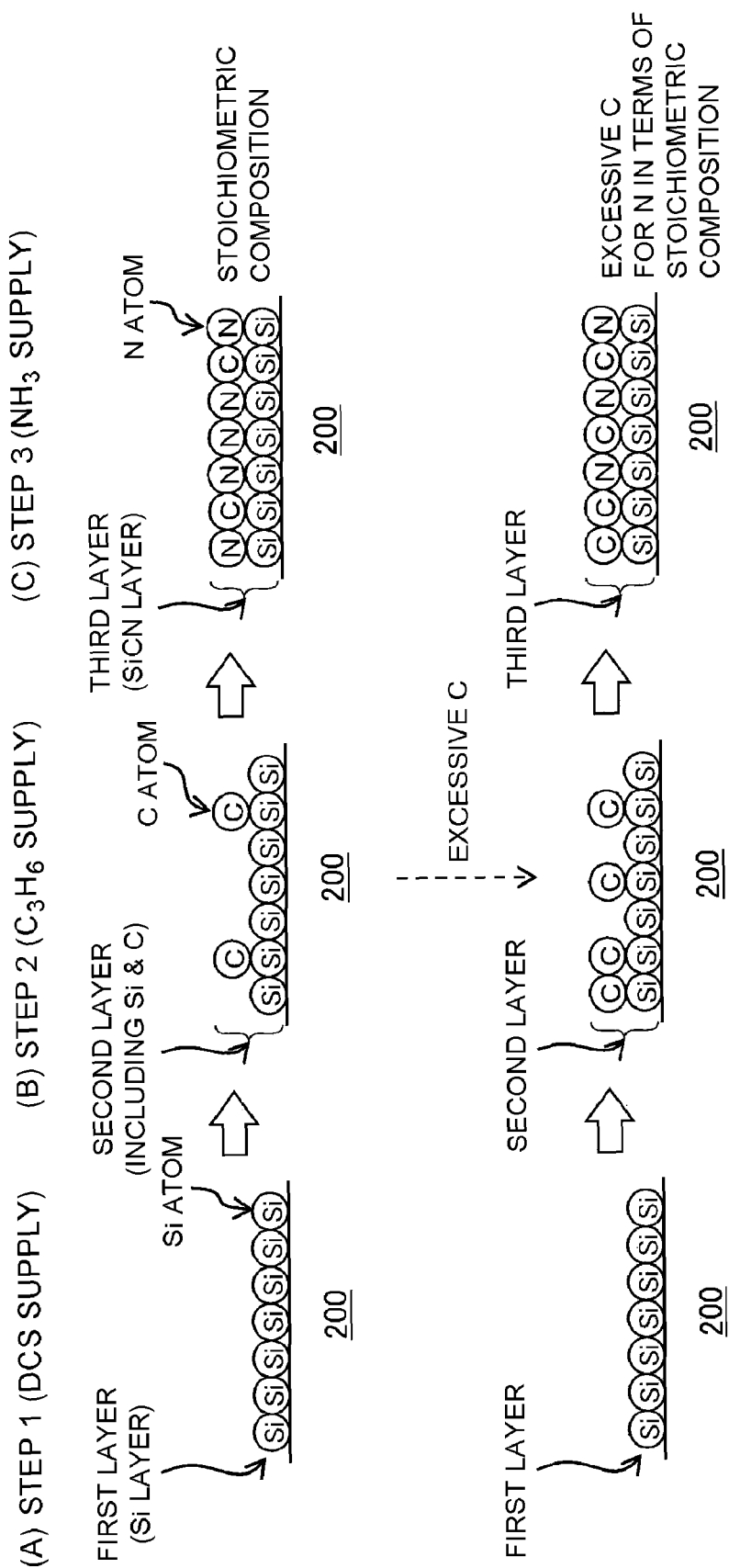
FIG. 10 is a schematic view illustrating a case where carbon is excessively supplied in Step 2 of the second sequence according to the embodiment of the present invention.
Figure 11:
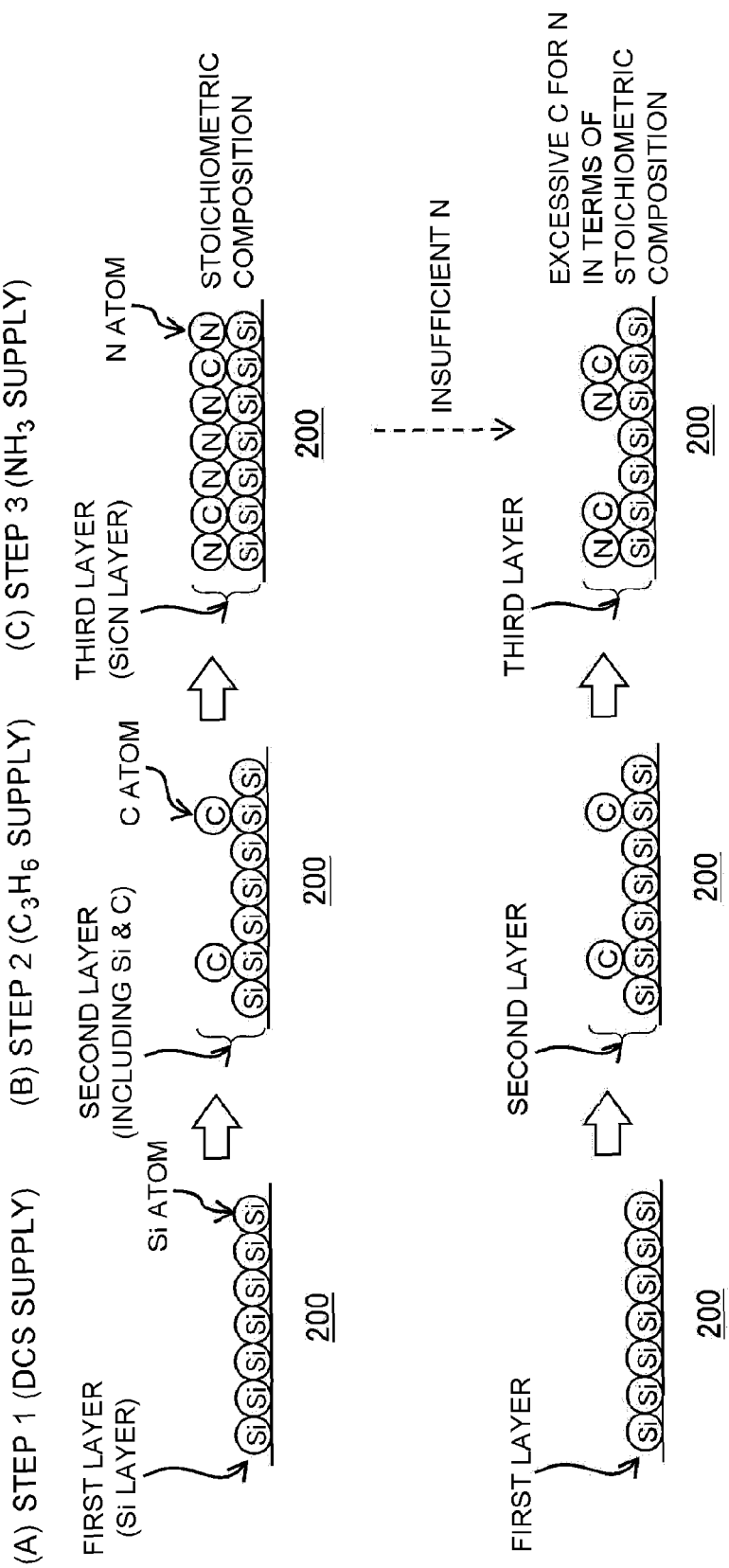
FIG. 11 is a schematic view illustrating a case where nitrogen is insufficiently supplied in Step 3 of the second sequence according to the embodiment of the present invention.

FIG. 4 is a view illustrating gas supply timing in the second sequence according to the embodiment of the present invention; FIG. 9 is a schematic view illustrating formation of a silicon carbonitride film on a wafer according to the second sequence of the embodiment of the present invention; FIG. 10 is a schematic view illustrating a case where carbon is excessively supplied in Step 2 of the second sequence according to the embodiment of the present invention; and FIG. 11 is a schematic view illustrating a case where nitrogen is insufficiently supplied in Step 3 of the second sequence according to the embodiment of the present invention. The second sequence of the embodiment relates to a method of controlling a composition ratio of a three-element system.

The second sequence of the embodiment includes steps of: forming a first layer including a first element being able to become solid state by itself on a wafer 200 by supplying a gas containing the first element (a first element-containing gas) into a process vessel in which the wafer 200 is accommodated under a condition that a CVD reaction occurs;

forming a second layer including the first element and a second element being able to become solid state by itself or being unable to become solid state by itself by supplying a gas containing the second element (a second element-containing gas) into the process vessel, wherein the second layer is formed by forming a layer including the second element on the first layer, or the second layer is formed by modifying the first layer; and forming a third layer including the first element, the second element, and a third element being unable to become solid state by itself by supplying a gas containing the third element (a third element-containing gas) into the process vessel to modify the second layer, wherein a cycle including the steps of forming the first layer, forming the second layer, and forming the third layer is performed at least once to form a thin film including the first to third elements and having a predetermined thickness.

The step of forming the first layer is the same as the step of forming the first layer in the first sequence. That is, process conditions, a motivated reaction, layers to be formed, layer thickness, examples of the first element, examples of the first element-containing gas, and examples of the first layer in the step of forming the first layer are the same as those in the step of forming the first layer in the first sequence.

In the step of forming the second layer, the second element-containing gas is activated by heat and is then supplied to the first layer, so that a layer including the second element and having less than one atomic layer to several atomic layers can be formed on the first layer or the first layer can be modified by a reaction between a part of the first layer and the second element-containing gas. As a result, the second layer including the first and second elements is formed.

When the second layer is formed by forming a layer including the second element on the first layer, the layer including the second element may be a second element layer or a second element-containing gas adsorption layer.

The second element-containing gas adsorption layer includes an adsorption layer formed of a material decomposed from the second element-containing gas. The second element layer is a general term for a layer made of the second element, such as a continuous layer, a discontinuous layer, and a thin film in which such layers are overlapped. Here, a continuous layer formed of the second element may also be called "a thin film." In addition, the second element-containing gas adsorption layer is a discontinuous chemical adsorption layer that is formed of molecules of the second element-containing gas or molecules of a material decomposed from the second element-containing gas, i.e., a chemical adsorption layer having less than one atomic layer. Preferably, the layer including the second element may be a discontinuous chemical adsorption layer formed of molecules of the second element-containing gas or molecules of a material decomposed from the second element-containing gas, improving the controllability of the composition ratio of the thin film.

When the second layer is formed by modifying the first layer, the first layer is modified by the same method as the method of modifying the first layer in the step of forming the second layer in the first sequence.

Since a soft reaction can occur by supplying the second element-containing gas after being activated by heat, rather than activated by plasma, soft modification can be performed. Accordingly, in the embodiment, the second element-containing gas is supplied after being activated by heat.

In the step of forming the third layer, the third element-containing gas is activated by heat and is then supplied to the second layer to modify the second layer, forming the third layer including the first to third elements. For example, when the second layer including the first and second elements and having several atomic layers is formed in the step of forming the second layer, a surface layer of the several atomic layers may be partially or entirely allowed to react with the third element-containing gas. Alternatively, the surface layer and the next lower layers among the several layers of the second layer including the first and second elements may be allowed to react with the third element-containing gas. However, when the second layer is constituted by the several atomic layers including the first and second elements, it may be preferable to modify only the surface layer of the second layer because controllability of the composition ratio of the thin film can be improved. An element being unable to become solid state by itself may be used as the third element. When the third element-containing gas may be supplied after being activated by heat, rather than being activated by plasma, a soft reaction can be generated, and soft modification can be performed. Accordingly, in the embodiment, the third element-containing gas is supplied after being activated by heat.

In the second sequence of the embodiment, the supply conditions are controlled such that the composition ratio of the thin film becomes the stoichiometric composition or another composition ratio different from the stoichiometric composition. For example, when the composition ratio of the thin film is controlled to become another predetermined composition ratio different from the stoichiometric composition, the internal pressure of the process vessel or the internal pressure and the gas supply time in the step of forming any one layer of the first, second and third layers are controlled to be higher or longer than the internal pressure of the process vessel or the internal pressure and the gas supply time in the step of forming any one layer when the thin film having the stoichiometric composition is formed.

Alternatively, the internal pressure of the process vessel or the internal pressure and the gas supply time in the step of forming another layer of the first, second and third layers are controlled to be lower or shorter than the internal pressure of the process vessel or the internal pressure and the gas supply time in the step of forming another layer when the thin film having the stoichiometric composition is formed.

As a result, one of the elements composing the composition of the thin film may be excessive in comparison with the others in terms of the stoichiometric composition.

In the case of a two-element thin film, the stoichiometric composition is unique. For example, the stoichiometric composition of a SiN film is unique, i.e., Si:N=3:4. However, in the case of a three-element thin film, the stoichiometric composition is not unique unlike the two-element thin film but is two or more. In the second sequence of the embodiment, a thin film having the stoichiometric composition or a composition ratio different from any of the stoichiometric compositions is formed.

A method of controlling a composition ratio of a thin film such that the first element is excessive in comparison with the second element in terms of the stoichiometric composition is the same as the method in the first sequence.

In the case that the composition ratio of the thin film is controlled such that the second element is excessive in comparison with the third element in terms of the stoichiometric composition or the composition ratio of the thin film is controlled such that the third element is excessive in comparison with the second element in terms of the stoichiometric composition, the composition ratio is controlled based on one of the elements.

For example, when the composition ratio of the thin film is controlled such that the second element is excessive in comparison with the third element in terms of the stoichiometric composition, the internal pressure of the process vessel or the internal pressure and the gas supply time in the step of forming of the second layer are controlled to be higher or longer than the internal pressure of the process vessel or the internal pressure and the gas supply time in the step of forming the second layer when the thin film having the stoichiometric composition is formed. By controlling the process conditions in this way, in comparison with the case where the thin film is formed to have the stoichiometric composition, the second element can be excessively supplied in the step of forming the second layer. And, due to the excessive supply of the second element in the step of forming the second layer, a region in which the modification reaction of the second layer can be caused in the step of forming the third layer is reduced. That is, in comparison with the case where the thin film is formed to have the stoichiometric composition, an excessive number of atoms of the second element are supplied in the step of forming the second layer, and thus, in the step of forming the third layer, the modification reaction of the second layer is suppressed.

Alternatively, the internal pressure of the process vessel or the internal pressure and the gas supply time in the step of forming of the third layer are controlled to be lower or shorter than the internal pressure of the process vessel or the internal pressure and the gas supply time in the step of forming the third layer when the thin film having the stoichiometric composition is formed. By controlling the process conditions in this way, in comparison with the case where the thin film is formed to have the stoichiometric composition, the third element can be insufficiently supplied in the step of forming the third layer. And, due to the insufficient supply of the third element in the step of forming the third layer, the modification reaction of the second layer is suppressed in the step of forming the third layer. That is, in comparison with the case where the thin film is formed to have the stoichiometric composition, an insufficient number of atoms of the third element are supplied in the step of forming the third layer, and thus, in the step of forming the third layer, the modification reaction of the second layer is suppressed.

In addition, for example, when the composition ratio of the thin film is controlled such that the third element is excessive in comparison with the second element in terms of the stoichiometric composition, the internal pressure of the process vessel or the internal pressure and the gas supply time in the step of forming the second layer are controlled to be lower or shorter than the internal pressure of the process vessel or the internal pressure and the gas supply time in the step of forming the second layer when the thin film having the stoichiometric composition is formed. By controlling the process conditions in this way, in comparison with the case where the thin film is formed to have the stoichiometric composition, the second element can be insufficiently supplied in the step of forming the second layer. And, due to the insufficient supply of the second element in the step of forming the second layer, a layer including the second element is formed in a smaller region or a modification reaction of the first layer is suppressed. As a result, the third element becomes relatively excessive in comparison with the second element in terms of the stoichiometric composition.

Meanwhile, when the second element is insufficiently supplied in the step of forming the second layer, a region in which the modification reaction of the second layer can be caused in the step of forming the third layer is increased. At this time, when the internal pressure of the process vessel or the internal pressure and the gas supply time in the step of forming the third layer are controlled to be higher or longer than the internal pressure of the process vessel or the internal pressure and the gas supply time in the step of forming the third layer when the thin film having the stoichiometric composition is formed, the third element can be excessively supplied in the step of forming the third layer, and thus the third element can be controlled to be further excessive in comparison with the second element in terms of the stoichiometric composition. That is, by combination of insufficient supply of the second element in the step of forming the second layer and excessive supply of the third element in the step of forming the third layer, the modification reaction of the second layer can be facilitated in the step of forming the third layer, and thus the composition ratio of the thin film can be controlled such that the third element is further excessive in comparison with the second element in terms of the stoichiometric composition.

Meanwhile, in the second sequence of the embodiment, formation of the thin film having the stoichiometric composition is also possible.

Hereinafter, the second sequence of the embodiment will be described more specifically. In the following description, an explanation will be given of an example where a silicon carbonitride (SiCN) film is formed on a substrate as an insulating film according to the sequence shown in FIG. 4 under the conditions that silicon (Si) is the first element, carbon (C) is the second element, nitrogen (N) is the third element, DCS gas, which is a silicon-containing gas, is used as the first element-containing gas, $C_3H_6$ gas, which is a carbon-containing gas, is used as the second element-containing gas, and $NH_3$ gas, which is a nitrogen-containing gas, is used as the third element-containing gas. Furthermore, in the following description of the example, the composition ratio of the silicon carbonitride film is controlled such that carbon (C) is excessive in comparison with nitrogen (N) in terms of the stoichiometric composition. In the example, the first gas supply system constitutes a silicon-containing gas supply system (a first element-containing gas supply system), the second gas supply system constitutes a carbon-containing gas supply system (a second element-containing gas supply system), and the fourth gas supply system constitutes a nitrogen-containing gas supply system (a third element-containing gas supply system).

Wafer charging, boat loading, pressure adjustment, temperature adjustment, and wafer rotation are performed in the same way as in the first sequence, and then, the following three steps are sequentially performed.

[Step 1]

Step 1 is performed in the same way as Step 1 of the first sequence. That is, process conditions, a motivated reaction, layers to be formed, layer thickness, examples of the first element, examples of the first element-containing gas, and examples of the first layer in Step 1 are the same as those in Step 1 of the first sequence (refer to of FIG. 9A). That is, in Step 1, the DCS gas is supplied into the process chamber 201, and thus, the silicon layer is formed on the wafer 200 as the first layer.

[Step 2]

After completion of Step 1 and removing a gas remaining in the process chamber 201, the valve 243b of the second gas supply pipe 232b is opened to allow a flow of $C_3H_6$ gas through the second gas supply pipe 232b. The flow rate of the $C_3H_6$ gas flowing through the second gas supply pipe 232b is controlled by the MFC 241b. Then, the $C_3H_6$ gas whose flow rate is controlled is supplied into the process chamber 201 through the gas supply holes 250b of the second nozzle 249b, horizontally flows on the surfaces of the wafers 200, and is exhausted through the exhaust pipe 231. At this time, the valve 243f is also opened to allow a flow of $N_2$ gas through the inert gas supply pipe 232f. The $N_2$ gas is supplied into the process chamber 201 together with the $C_3H_6$ gas, horizontally flows on the surfaces of the wafers 200, and is exhausted through the exhaust pipe 231. At this time, a main flow of the gas in the process chamber 201 is in a horizontal direction, i.e, parallel to the surfaces of the wafers 200.

At this time, the APC valve 244 is properly controlled to adjust the internal pressure of the process chamber 201, for example, in a range of 50 Pa to 3000 Pa. The flow rate of the $C_3H_6$ gas controlled by the MFC 241b is, for example, in a range of 100 sccm to 10000 sccm. The time during exposure of the wafers 200 to the $C_3H_6$ gas, i.e., gas supply time (exposure time), is in a range of, for example, 1 second to 120 seconds. At this time, like in Step 1, the temperature of the heater 207 is set to a predetermined temperature so that the temperature of the wafers 200 can be in a range of, for example, 350° C. to 700° C. When the $C_3H_6$ gas is activated by heat and then supplied, a soft reaction can be caused, and thus a carbon-containing layer can be easily formed, which will be described later.

At this time, a gas flowing in the process chamber 201 is $C_3H_6$ gas activated by heat, and DCS gas does not flow in the process chamber 201. Therefore, without causing a vapor-phase reaction, the $C_3H_6$ gas which is in an activated state is supplied to the wafers 200, and at this time, as shown in FIG. 9B, a carbon-containing layer having less than one atomic layer, i.e., a discontinuous carbon-containing layer, is formed on a silicon layer formed on the wafer 200 in Step 1. As a result, a second layer including silicon (a first element) and carbon (a second element) is formed. Meanwhile, according to conditions, a part of the silicon layer reacts with the $C_3H_6$ gas, and thus, the silicon layer is modified (carbonized) to form a second layer including silicon and carbon.

The carbon-containing layer formed on the silicon layer may be a carbon layer (a C-layer), a chemical adsorption layer of $C_3H_6$, that is, a chemical adsorption layer of $C_xH_y$ (a material decomposed from $C_3H_6$). It is necessary for the carbon layer to be a discontinuous layer made of carbon. In addition, it is necessary for the chemical adsorption layer of $C_xH_y$ to be a discontinuous chemical adsorption layer made of $C_xH_y$ molecules. When the carbon-containing layer formed on the silicon layer is a continuous layer, for example, when adsorption of $C_xH_y$ on the silicon layer is saturated and thus a continuous chemical adsorption layer of $C_xH_y$ is formed on the silicon layer, the entire surface of the silicon layer is covered with the chemical adsorption layer of $C_xH_y$. In this case, there is no silicon on the surface of the second layer, and thus it is difficult to cause the nitridation reaction of the second layer in Step 3, which will be described later. This is because nitrogen couples with silicon but does not couple with carbon. To cause a desired nitridation reaction in Step 3, which will be described later, adsorption of $C_xH_y$ on the silicon layer should be non-saturated so that silicon can be exposed on the surface of the second layer.

Thereafter, the valve 243b of the second gas supply pipe 232b is closed to interrupt supply of $C_3H_6$ gas. At this time, in a state in which the APC valve 244 of the exhaust pipe 231 is opened, the inside of the process chamber 201 is vacuum-evacuated using the vacuum pump 246 so that $C_3H_6$ gas remaining in the process chamber 201 without participating in a reaction or after participating in the formation of the carbon-containing layer can be removed from the process chamber 201. At this time, in a state in which the valve 243f is opened, supply of $N_2$ gas into the process chamber 201 is continued. Due to this, the $C_3H_6$ gas remaining in the process chamber 201 without participating in a reaction or after participating in the formation of the carbon-containing layer can be removed from the process chamber 201 more effectively. At this time, the gas remaining in the process chamber 201 may not be completely removed therefrom, that is, the inside of the process chamber 201 may not be completely purged. When a small amount of gas remains in the process chamber 201, there is no ill effect due to the remaining gas in Step 3 to be performed thereafter. At this time, there is no need to supply a large amount of $N_2$ gas into the process chamber 201. For example, a flow rate of the $N_2$ gas supplied into the process chamber 201 may be controlled to supply the same amount of gas as a capacity of the reaction tube 203 (the process chamber 201), so that the purge can be performed with no ill effect in Step 3. As described above, as the inside of the process chamber 201 is not completely purged, a purge time can be reduced and throughput can be improved. In addition, consumption of the $N_2$ gas can be maximally suppressed.

As a carbon-containing gas, not only $C_3H_6$ gas, but also another gas such as acetylene ($C_2H_2$) or ethylene ($C_2H_4$) gas may be used.

[Step 3]

After removing the gas remaining in the process chamber 201, the valve 243d of the fourth gas supply pipe 232d is opened to allow a flow of $NH_3$ gas through the fourth gas supply pipe 232d. The flow rate of the $NH_3$ gas flowing through the fourth gas supply pipe 232d is controlled by the MFC 241d. Then, the $NH_3$ gas whose flow rate is controlled is supplied into the process chamber 201 through the gas supply holes 250d of the fourth nozzle 249d, horizontally flows on the surfaces of the wafers 200, and is exhausted through the gas exhaust pipe 231. At this time, the valve 243h is also opened to allow a flow of $N_2$ gas through the inert gas supply pipe 232h. Then, together with the $NH_3$ gas, the $N_2$ gas is supplied into the process chamber 201, horizontally flows on the surfaces of the wafers 200, and is exhausted through the exhaust pipe 231. At this time, in the process chamber 201, the gas mainly flows in a horizontal direction, that is, parallel to the surface of the wafers 200.

At this time, the APC valve 244 is properly controlled to adjust the internal pressure of the process chamber 201, for example, in a range of 50 Pa to 3000 Pa. The flow rate of the $NH_3$ gas controlled by the MFC 241d is, for example, in a range of 100 sccm to 10000 sccm. The time during exposure of the wafers 200 to the $NH_3$ gas, i.e., gas supply time (exposure time), is in a range of, for example, 1 second to 120 seconds. At this time, like in Step 1, the temperature of the heater 207 is set to a predetermined temperature so that the temperature of the wafers 200 can be in a range of, for example, 350° C. to 700° C. Since it is difficult to make the $NH_3$ gas reactive at the above-mentioned temperature range of the wafers 200 due to a high reaction temperature of the $NH_3$ gas, the process chamber 201 is kept at a relatively high pressure as mentioned above to activate the $NH_3$ gas by heat. When the $NH_3$ gas is activated by heat and then supplied, a soft reaction can be caused, and soft nitridation, which will be described later, can be performed.

At this time, the gas flowing in the process chamber 201 is thermally-activated $NH_3$ gas, and neither DCS gas nor $C_3H_6$ gas flows in the process chamber 201. Therefore, without causing a vapor-phase reaction, the activated $NH_3$ gas reacts with a part of the layer including silicon and carbon, i.e., a part of the second layer formed on each of the wafers 200 in Step 2. As a result, the second layer is nitrided and modified into a third layer including silicon (a first element), carbon (a second element), and nitrogen (a third element), i.e., into a silicon carbonitride (SiCN) layer.

At this time, as shown in FIG. 9C, the nitridation reaction of the second layer is not saturated. For example, when a silicon layer having several atomic layers is formed in Step 1 and a carbon-containing layer having less than one atomic layer is formed in Step 2, a part of the surface layer (the surface atomic layer) of the atomic layers is nitrided. That is, a region (silicon-exposed region) of the surface layer that can be nitrided is partially or entirely nitrided. In this case, so as not to entirely nitride the second layer, the nitridation of the second layer is performed under a non-saturated condition. Alternatively, according to conditions, while the surface layer and the next lower layers among the atomic layers of the second layer can be nitrided, the case where only the surface layer is nitrided is preferable because the composition ratio of the silicon carbonitride film can be controlled more easily. In addition, for example, even when a silicon layer having one atomic layer or less than one atomic layer is formed in Step 1 and a carbon-containing layer having less than one atomic layer is formed in Step 2, a part of the surface layer is nitrided in the same way. Even in this case, similarly, so as not to nitride the entire second layer, nitridation is performed under a condition that the nitridation reaction of the second layer is not saturated.

Thereafter, the valve 243d of the fourth gas supply pipe 232d is closed to interrupt the supply of $NH_3$ gas. At this time, in a state in which the APC valve 244 of the exhaust pipe 231 is opened, the inside of the process chamber 201 is vacuum-evacuated using the vacuum pump 246 so that the $NH_3$ gas remaining in the process chamber 201 without participating in the nitridation reaction or after participating in the nitridation reaction can be removed from the process chamber 201. Furthermore, at this time, in a state in which the valve 243h is opened, supply of $N_2$ gas into the process chamber 201 is continued. Due to this, $NH_3$ gas remaining in the process chamber 201 without participating in the nitridation reaction or after participating in the nitridation reaction can be removed from the process chamber 201 more effectively. At this time, the gas remaining in the process chamber 201 may not be completely removed, that is, the inside of the process chamber 201 may not be completely purged. When a small amount of gas remains in the process chamber 201, there is no ill effect in Step 1 to be performed thereafter. At this time, there is no need to supply a large amount of $N_2$ gas into the process chamber 201. For example, a flow rate of the $N_2$ gas supplied into the process chamber 201 may be controlled to supply the same amount of gas as a capacity of the reaction tube 203 (the process chamber 201), so that the purge can be performed with no ill effect in Step 1. As described above, as the inside of the process chamber 201 is not completely purged, a purge time can be reduced and throughput can be improved. In addition, consumption of the $N_2$ gas can be maximally suppressed.

As a nitrogen-containing gas, not only $NH_3$ gas but also another gas such as $N_2$ gas, $NF_3$ gas, $N_2H_4$ gas or $N_3H_8$ gas may be used.

By setting the above-described Step 1 to Step 3 to one cycle and performing this cycle at least once, a thin film including silicon (a first element), carbon (a second element), and nitrogen (a third element), i.e., a silicon carbonitride (SiCN) film, may be formed on each of the wafers 200 to a predetermined thickness. Preferably, the cycle may be repeated a plurality of times.

In Step 2, the internal pressure of the process chamber 201, or the internal pressure of the process chamber 201 and the gas supply time are controlled to be higher or longer than the internal pressure of the process chamber 201, or the internal pressure of the process chamber 201 and the gas supplying time in Step 2 when the silicon carbonitride film having a stoichiometric composition is formed. By controlling the process conditions in this way, in comparison with the case where the silicon carbonitride film is formed to have the stoichiometric composition, carbon can be excessively supplied in Step 2 (refer to FIG. 10B). Therefore, due to the excessive supply of carbon in Step 2, a region (silicon exposed region) in which the nitridation reaction of the second layer can be caused in Step 3 is reduced. That is, in comparison with the case where the silicon carbonitride film is formed to have the stoichiometric composition, an excessive number of carbon atoms are supplied in Step 2, and thus, in Step 3, the nitridation reaction of the second layer is suppressed. As a result, the composition ratio of the silicon carbonitride (SiCN) film can be controlled such that carbon (C) is excessive in comparison with nitrogen (N) in terms of the stoichiometric composition.

In the upper side of FIG. 10, schematic partial section views of a wafer are shown to explain reaction states in steps during formation of a SiCN film having a stoichiometric composition. In the lower side of FIG. 10, schematic partial section views of a wafer are shown to explain reaction states in steps during formation of a SiCN film having excessive carbon (C) in comparison with nitrogen (N) in terms of the stoichiometric composition by excessively supplying carbon (C). FIGS. 10A to 10C illustrate reaction states in Step 1 to Step 3, respectively.

Alternatively, in Step 3, the internal pressure of the process chamber 201, or the internal pressure of the process chamber 201 and the gas supply time are controlled to be lower or shorter than the internal pressure of the process chamber 201, or the internal pressure of the process chamber 201 and the gas supplying time in Step 3 when the silicon carbonitride film having the stoichiometric composition is formed. By controlling the process conditions in this way, in comparison with the case where the silicon carbonitride film is formed to have the stoichiometric composition, nitrogen can be insufficiently supplied in Step 3 (refer to FIG. 11C). Therefore, due to the insufficient supply of nitrogen in Step 3, the nitridation reaction of the second layer is suppressed in Step 3. That is, in comparison with the case where the silicon carbonitride film is formed to have the stoichiometric composition, an insufficient number of nitrogen atoms are supplied in Step 3, and thus, in Step 3, the nitridation reaction of the second layer is suppressed. As a result, the composition ratio of the silicon carbonitride (SiCN) film can be controlled such that carbon (C) is excessive in comparison with nitrogen (N) in terms of the stoichiometric composition.

In the upper side of FIG. 11, schematic partial section views of a wafer are shown to explain reaction states in steps during formation of a SiCN film having a stoichiometric composition. In the lower side of FIG. 11, schematic partial section views of a wafer are shown to explain reaction states in steps during formation of a SiCN film having excessive carbon (C) in comparison with nitrogen (N) in terms of the stoichiometric composition by insufficiently supplying nitrogen (N). FIGS. 11A to 11C illustrate reaction states in Step 1 to Step 3, respectively.

As described above, in the second sequence of the embodiment, the internal pressure of the process chamber 201, or the internal pressure of the process chamber 201 and the gas supply time are controlled in each step to control a balance between a supply amount (deposition amount) of silicon in Step 1, a supply amount (adsorption amount or reaction amount) of carbon in Step 2, and a supply amount (reaction amount) of nitrogen in Step 3, such that the composition ratio of the silicon carbonitride film is controlled. Meanwhile, in the second sequence of the embodiment, as the balance between the supply amount (deposition amount) of silicon in Step 1, the supply amount (adsorption amount or reaction amount) of carbon in Step 2, and the supply amount (reaction amount) of nitrogen in Step 3 is controlled, formation of the silicon carbonitride film having the stoichiometric composition is also possible. Even in this case, control of the balance between the supply amount (deposition amount) of silicon in Step 1, the supply amount (adsorption amount or reaction amount) of carbon in Step 2, and the supply amount (reaction amount) of nitrogen in Step 3 is performed by controlling the internal pressure of the process chamber 201, or the internal pressure of the process chamber 201 and the gas supply time in each step.

After a silicon carbonitride film having a predetermined composition and thickness is formed in the film-forming process, gas purge, replacement with inert gas, return to the atmospheric pressure, boat unloading, and wafer discharging are performed in the same way as in the first sequence.

In the above-described example of the second sequence of the embodiment, while a silicon-containing gas, a carbon-containing gas, and a nitrogen-containing gas are used as a first element-containing gas, a second element-containing gas, and a third element-containing gas, respectively, to form a SiCN film, the present invention is not limited to the example but various changes and modifications may be made without departing from the scope of the present invention.

For example, a silicon-containing gas, a nitrogen-containing gas, and an oxygen-containing gas may be used as a first element-containing gas, a second element-containing gas, and a third element-containing gas, respectively, to form a silicon oxynitride (SiON) film; or a silicon-containing gas, a boron-containing gas, and a nitrogen-containing gas may be used as a first element-containing gas, a second element-containing gas, and a third element-containing gas, respectively, to form a silicon boron nitride (SiBN) film. In addition, for example, a boron-containing gas, a carbon-containing gas, and a nitrogen-containing gas may be used as a first element-containing gas, a second element-containing gas, and a third element-containing gas, respectively, to form a boron carbonitride (BCN) film; an aluminum-containing gas, a boron-containing gas, and a nitrogen-containing gas may be used as a first element-containing gas, a second element-containing gas, and a third element-containing gas, respectively, to form an aluminum boron nitride (AlBN) film; or a silicon-containing gas, a carbon-containing gas, and an oxygen-containing gas may be used as a first element-containing gas, a second element-containing gas, and a third element-containing gas, respectively, to form a silicon oxycarbide (SiOC) film. Furthermore, a titanium-containing gas, an aluminum-containing gas, and a nitrogen-containing gas may be used as a first element-containing gas, a second element-containing gas, and a third element-containing gas, respectively, to form a titanium aluminum nitride (TiAlN) film; or a silicon-containing gas, an aluminum-containing gas, and a nitrogen-containing gas may be used as a first element-containing gas, a second element-containing gas, and a third element-containing gas, respectively, to form a silicon aluminum nitride (SiAlN) film. The same gas species as gas species exemplified in the description of the first sequence may also be used.

As described above, according to the second sequence of the embodiment, a semiconductor element such as silicon (Si) or boron (B), or a metal element such as aluminum (Al) or titanium (Ti) may be used as a first element; an element such as nitrogen (N), boron (B), carbon (C), or oxygen (O), or a metal such as aluminum (Al) may be used as a second element; and an element such as nitrogen (N) or oxygen (O) may be used as a third element.

(Third Sequence)

Next, a third sequence according to the embodiment will now be described.

Figure 5:
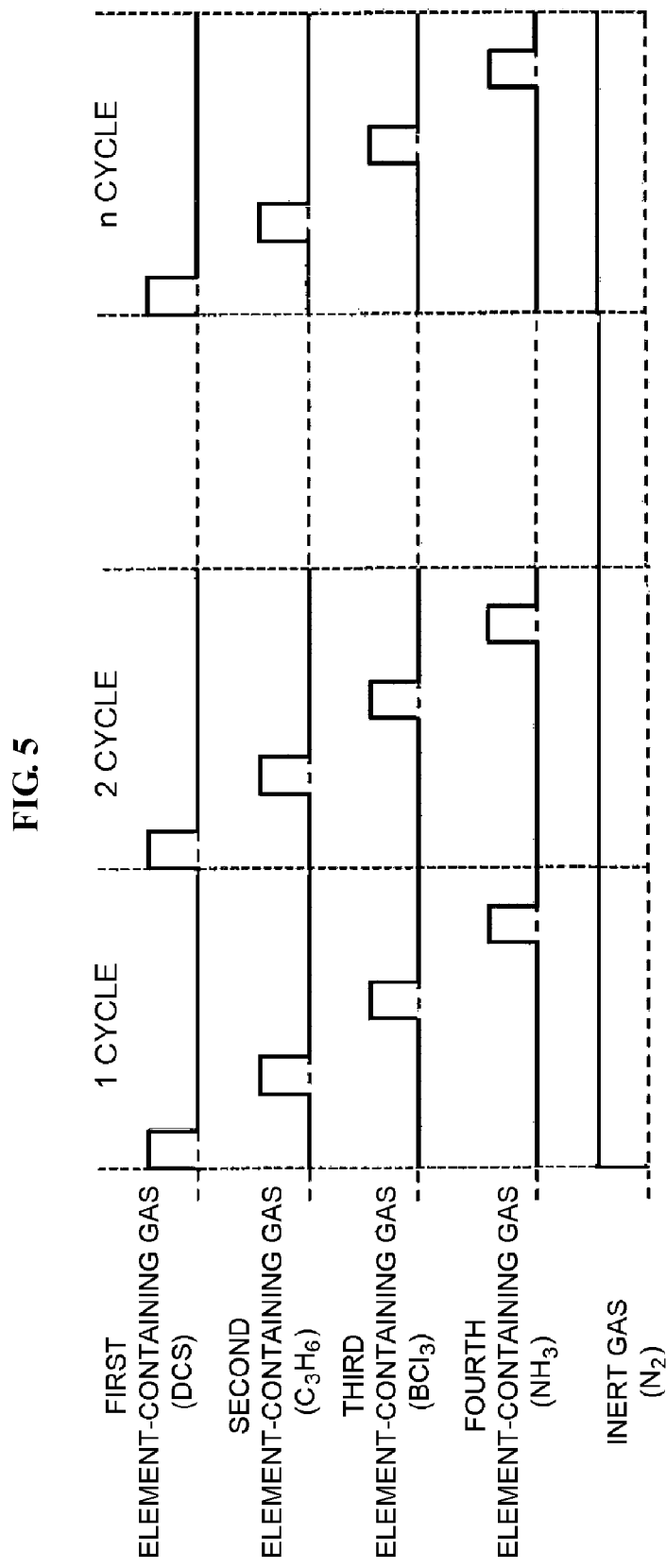
FIG. 5 is a view illustrating gas supply timing in a third sequence according to an embodiment of the present invention.
Figure 12:
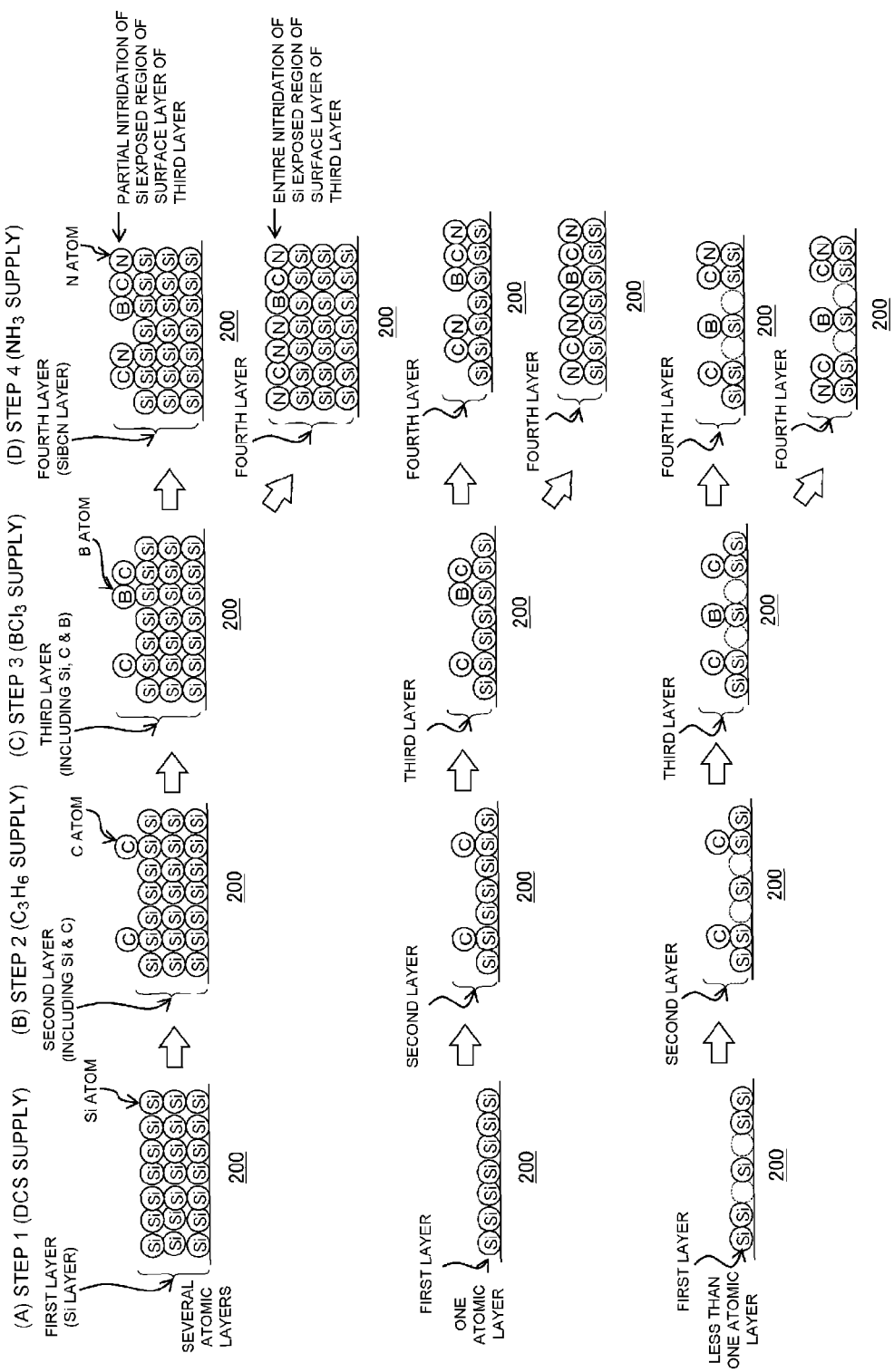
FIG. 12 is a schematic view illustrating formation of a silicon boron carbonitride film on a wafer in the third sequence according to the embodiment of the present invention.
Figure 13:
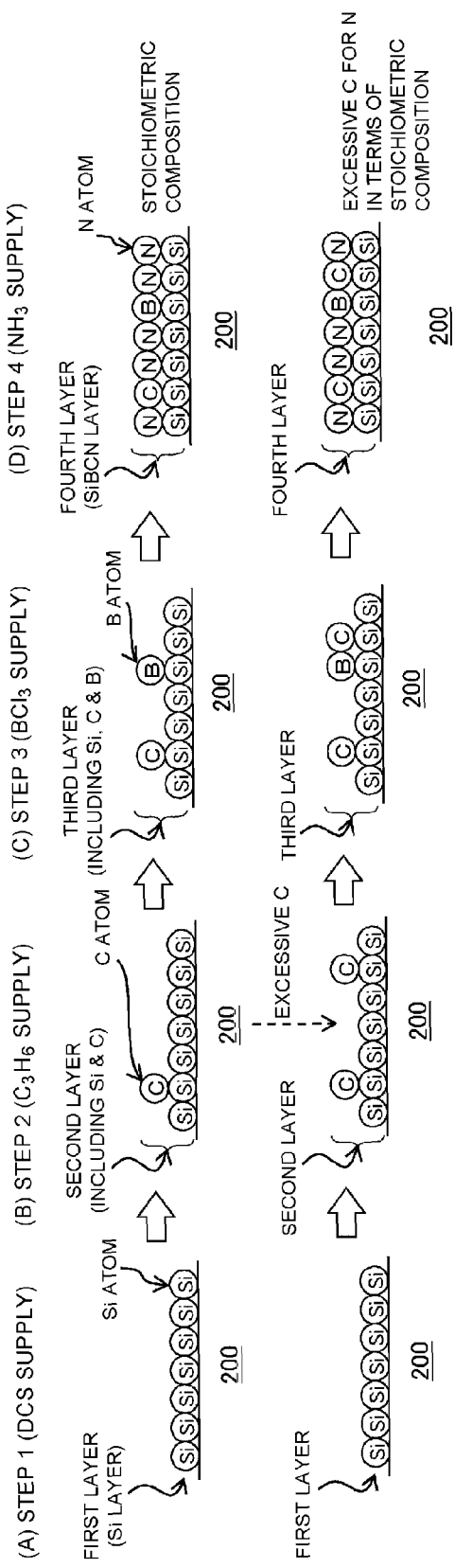
FIG. 13 is a schematic view illustrating a case where carbon is excessively supplied in Step 2 of the third sequence according to the embodiment of the present invention.
Figure 14:
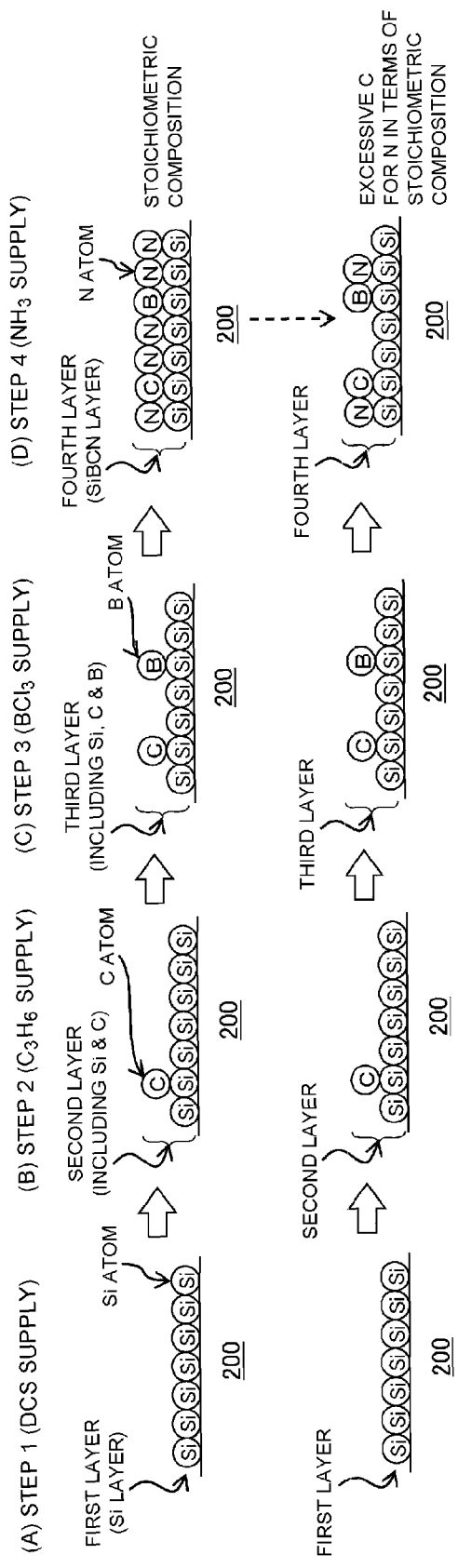
FIG. 14 is a schematic view illustrating a case where nitrogen is insufficiently supplied in Step 4 of the third sequence according to the embodiment of the present invention.

FIG. 5 is a view illustrating gas supply timing in the third sequence according to the embodiment of the present invention; FIG. 12 is a schematic view illustrating formation of a silicon boron carbonitride film on a wafer in the third sequence according to the embodiment of the present invention; FIG. 13 is a schematic view illustrating a case where carbon is excessively supplied in Step 2 of the third sequence according to the embodiment of the present invention; and FIG. 14 is a schematic view illustrating a case where nitrogen is insufficiently supplied in Step 4 of the third sequence according to the embodiment of the present invention. The third sequence of the embodiment relates to a method of controlling a composition ratio of a four-element system.

The third sequence of the embodiment includes steps of: forming a first layer including a first element being able to become solid state by itself on a wafer 200 by supplying a gas containing the first element (a first element-containing gas) into a process vessel in which the wafer 200 is accommodated under a condition that a CVD reaction occurs;

forming a second layer including the first element and a second element being able to become solid state by itself or being unable to become solid state by itself by supplying a gas containing the second element (a second element-containing gas) into the process vessel, wherein the second layer is formed by forming a layer including the second element on the first layer, or the second layer is formed by modifying the first layer;

forming a third layer including the first element, the second element, and a third element being able to become solid state by itself or being unable to become solid state by itself by supplying a gas containing the third element (a third element-containing gas) into the process vessel, wherein the third layer is formed by forming a layer including the third element on the second layer, or the third layer is formed by modifying the second layer; and forming a fourth layer including the first to third elements and a fourth element being unable to become solid state by itself by supplying a gas containing the fourth element (a fourth element-containing gas) into the process vessel to modify the third layer, wherein a cycle including the steps of forming the first layer, forming the second layer, forming the third layer, and forming the fourth layer is performed at least once to form a thin film including the first to fourth elements and having a predetermined thickness.

The step of forming the first layer is the same as the step of forming the first layer in the second sequence. That is, process conditions, a motivated reaction, layers to be formed, layer thickness, examples of the first element, examples of the first element-containing gas, and examples of the first layer in the step of forming the first layer are the same as those in the step of forming the first layer in the second sequence.

The step of forming the second layer is the same as the step of forming the second layer in the second sequence. That is, process conditions, a gas activating method, a motivated reaction, layers to be formed, examples of the second element, examples of the second element-containing gas, and examples of the second layer in the step of forming the second layer are the same as those in the step of forming the second layer in the second sequence.

In the step of forming the third layer, the third element-containing gas is activated by heat and is then supplied to the second layer, so that a layer including the third element and having less than one atomic layer to several atomic layers can be formed on the second layer or the second layer can be modified by a reaction between a part of the second layer and the third element-containing gas. As a result, the third layer including the first to third elements is formed.

When the third layer is formed by forming a layer including the third element on the second layer, the layer including the third element may be a third element layer or a third element-containing gas adsorption layer. The third element-containing gas adsorption layer includes an adsorption layer formed of a material decomposed from the third element-containing gas. The third element layer is a general term for a layer made of the third element, such as a continuous layer, a discontinuous layer, and a thin film in which such layers are overlapped. Here, a continuous layer formed of the third element may also be called "a thin film." In addition, the third element-containing gas adsorption layer is a discontinuous chemical adsorption layer that is formed of molecules of the third element-containing gas or molecules of a material decomposed from the third element-containing gas, that is, a chemical adsorption layer having less than one atomic layer. Preferably, the layer including the third element may be a discontinuous chemical adsorption layer formed of molecules of the third element-containing gas or molecules of a material decomposed from the third element-containing gas, improving the controllability of the composition ratio of the thin film.

When the third layer is formed by modifying the second layer, the second layer is modified by the same method as the method of modifying the second layer in the step of forming the third layer in the second sequence.

The third element-containing gas is supplied after being activated by heat, rather than being activated by plasma to cause a soft reaction, performing soft modification. Accordingly, in the embodiment, the third element-containing gas is activated by heat and then supplied.

In the step of forming the fourth layer, the fourth element-containing gas is activated by heat and then supplied to the third layer to modify the third layer, forming the fourth layer including the first to fourth elements. For example, when the third layer including the first to third elements and having several atomic layers is formed in the step of forming the third layer, a surface layer of the several atomic layers may be partially or entirely allowed to react with the fourth element-containing gas. Alternatively, the surface layer and the next lower layers among the several atomic layers of the third layer including the first to third elements may be allowed to react with the fourth element-containing gas. However, when the third layer is constituted by the several atomic layers including the first to third elements, it may be preferable to modify only the surface layer of the third layer because the composition ratio of the thin film can be controlled more easily. Preferably, the fourth element may be an element being unable to become solid state by itself. When the fourth element-containing gas may be supplied after being activated by heat, rather than being activated by plasma, a soft reaction can be generated, and soft modification can be performed. Accordingly, in the embodiment, the fourth element-containing gas is activated by heat and then supplied.

In the third sequence of the embodiment, the supply conditions are controlled such that the composition ratio of the thin film becomes the stoichiometric composition or a composition ratio different from the stoichiometric composition. For example, when the composition ratio of the thin film is controlled to be a predetermined composition ratio different from the stoichiometric composition, the internal pressure of the process vessel or the internal pressure and the gas supply time in the step of forming any one layer of the first to fourth layers are controlled to be higher or longer than the internal pressure of the process vessel or the internal pressure and the gas supply time in the step of forming any one layer when the thin film having the stoichiometric composition is formed.

Alternatively, when the composition ratio of the thin film is controlled to be a predetermined composition ratio different from the stoichiometric composition, the internal pressure of the process vessel or the internal pressure and the gas supply time in the step of forming another layer of the first to fourth layers are controlled to be lower or shorter than the internal pressure of the process vessel or the internal pressure and the gas supply time in the step of forming another layer when the thin film having the stoichiometric composition is formed.

As a result, one of the elements composing the thin film may be excessive in comparison with the others in terms of the stoichiometric composition.

In the case of a four-element thin film, the stoichiometric composition is not unique unlike the two-element thin film but is two or more like the three-element thin film. In the third sequence of the embodiment, a thin film having the stoichiometric composition or a composition ratio different from any of the stoichiometric compositions is formed.

The method of controlling the composition ratio of the thin film such that the first element is excessive in comparison with the second element in terms of the stoichiometric composition is the same as the method in the first and second sequences.

The method of controlling the composition ratio of the thin film such that the second element is excessive in comparison with the third element in terms of the stoichiometric composition or the third element is excessive in comparison with the second element in terms of the stoichiometric composition is the same as the method in the second sequence.

When the composition ratio of the thin film is controlled such that the second or third element is excessive in comparison with the fourth element in terms of the stoichiometric composition or the fourth element is excessive in comparison with the second or third element in terms of the stoichiometric composition, the composition ratio is controlled based on one of the elements.

For example, when the composition ratio of the thin film is controlled such that the second element is excessive in comparison with the fourth element in terms of the stoichiometric composition, the internal pressure of the process vessel or the internal pressure and the gas supply time in the step of forming the second layer are controlled to be higher or longer than the internal pressure of the process vessel or the internal pressure and the gas supply time in the step of forming the second layer when the thin film having the stoichiometric composition is formed. By controlling the process conditions in this way, in comparison with the case where the thin film is formed to have the stoichiometric composition, the second element can be excessively supplied in the step of forming the second layer. And, due to the excessive supply of the second element in the step of forming the second layer, a region in which the modification reaction of the third layer can be caused in the step of forming the fourth layer is reduced. That is, in comparison with the case where the thin film is formed to have the stoichiometric composition, an excessive number of atoms of the second element are supplied in the step of forming the second layer, and thus, in the step of forming the fourth layer, the modification reaction of the third layer is suppressed.

Alternatively, the internal pressure of the process vessel or the internal pressure and the gas supply time in the step of forming the fourth layer are controlled to be lower or shorter than the internal pressure of the process vessel or the internal pressure and the gas supply time in the step of forming the fourth layer when the thin film having the stoichiometric composition is formed. By controlling the process conditions in this way, in comparison with the case where the thin film is formed to have the stoichiometric composition, the fourth element can be insufficiently supplied in the step of forming the fourth layer. And, due to the insufficient supply of the fourth element in the step of forming the fourth layer, the modification reaction of the third layer is suppressed in the step of forming the fourth layer. That is, in comparison with the case where the thin film is formed to have the stoichiometric composition, an insufficient number of atoms of the fourth element are supplied in the step of forming the fourth layer, and thus, in the step of forming the fourth layer, the modification reaction of the third layer is suppressed.

In addition, for example, when the composition ratio of the thin film is controlled such that the fourth element is excessive in comparison with the second element in terms of the stoichiometric composition, the internal pressure of the process vessel or the internal pressure and the gas supply time in the step of forming of the second layer are controlled to be lower or shorter than the internal pressure of the process vessel or the internal pressure and the gas supply time in the step of forming the second layer when the thin film having the stoichiometric composition is formed. By controlling the process conditions in this way, in comparison with the case where the thin film is formed to have the stoichiometric composition, the second element can be insufficiently supplied in the step of forming the second layer. And, due to the insufficient supply of the second element in the step of forming the second layer, a layer including the second element is formed in a smaller region or a modification reaction of the first layer is suppressed. As a result, the fourth element becomes relatively excessive in comparison with the second element in terms of the stoichiometric composition.

When the second element is insufficiently supplied in the step of forming the second layer, a region in which the modification reaction of the third layer can be caused in the step of forming the fourth layer is increased. At this time, when the internal pressure of the process vessel or the internal pressure and the gas supply time in the step of forming the fourth layer are controlled to be higher or longer than the internal pressure of the process vessel or the internal pressure and the gas supply time in the step of forming the fourth layer when the thin film having the stoichiometric composition is formed, the fourth element can be excessively supplied in the step of forming the fourth layer, and thus the fourth element can be controlled to be further excessive in comparison with the second element in terms of the stoichiometric composition. That is, by combination of insufficient supply of the second element in the step of forming the second layer and excessive supply of the fourth element in the step of forming the fourth layer, the modification reaction of the third layer can be facilitated in the step of forming the fourth layer, and thus the composition ratio of the thin film can be controlled such that the fourth element is further excessive in comparison with the second element in terms of the stoichiometric composition.

Meanwhile, in the third sequence of the embodiment, formation of the thin film having the stoichiometric composition is also possible.

Hereinafter, the third sequence of the embodiment will be described in detail. In the following description, an explanation will be given on an example where a silicon boron carbonitride (SiBCN) film is formed on a substrate as an insulating film according to the sequence shown in FIG. 5 under the conditions that silicon (Si) is the first element, carbon (C) is the second element, boron (B) is the third element, nitrogen (N) is the fourth element, DCS gas, which is the silicon-containing gas, is used as the first element-containing gas, $C_3H_6$ gas, which is the carbon-containing gas, is used as the second element-containing gas, $BCl_3$ gas, which is the boron-containing gas, is used as the third element-containing gas, and $NH_3$ gas, which is the nitrogen-containing gas, is used as a fourth element-containing gas. Furthermore, in the following description of the example, the composition ratio of the silicon boron carbonitride film is controlled such that carbon (C) is excessive in comparison with nitrogen (N) in terms of the stoichiometric composition. In the example, the first gas supply system constitutes a silicon-containing gas supply system (a first element-containing gas supply system), the second gas supply system constitutes a carbon-containing gas supply system (a second element-containing gas supply system), the third gas supply system constitutes a boron-containing gas supply system (a third element-containing gas supply system), and the fourth gas supply system constitutes a nitrogen-containing gas supply system (a fourth element-containing gas supply system).

Wafer charging, boat loading, pressure adjustment, temperature adjustment, and wafer rotation are performed in the same way as in the second sequence, and then, the following four steps are sequentially performed.

[Step 1]

Step 1 is performed in the same way as Step 1 of the second sequence. That is, process conditions, a motivated reaction, layers to be formed, layer thickness, examples of the first element, examples of the first element-containing gas, and examples of the first layer in Step 1 are the same as those in Step 1 of the second sequence (refer to FIG. 12A). That is, in Step 1, by supply of the DCS gas into the process chamber 201, the silicon layer is formed on the wafer 200 as the first layer.

[Step 2]

Step 2 is performed in the same way as Step 2 of the second sequence. That is, process conditions, a gas activating method, a motivated reaction, layers to be formed, examples of the second element, examples of the second element-containing gas, and examples of the second layer in Step 2 are the same as those in Step 2 of the second sequence (refer to FIG. 12B). That is, in Step 2, the second layer including silicon and carbon is formed by supply of the $C_3H_6$ gas into the process chamber.

[Step 3]

After completion of Step 2 and removal of the gas remaining in the process chamber 201, the valve 243c of the third gas supply pipe 232c is opened to allow a flow of $BCl_3$ gas through the third gas supply pipe 232c. The flow rate of the $BCl_3$ gas flowing through the third gas supply pipe 232c is controlled by the MFC 241c. Then, the $BCl_3$ gas whose flow rate is controlled is supplied into the process chamber 201 through the gas supply holes 250c of the third nozzle 249c, horizontally flows on the surfaces of the wafers 200, and is exhausted through the exhaust pipe 231. At this time, the valve 243g is also opened to allow a flow of $N_2$ gas through the inert gas supply pipe 232g. The $N_2$ gas is supplied into the process chamber 201 together with the $BCl_3$ gas, horizontally flows on the surfaces of the wafers 200, and is exhausted through the exhaust pipe 231. At this time, a main flow of the gas in the process chamber 201 is in a horizontal direction, i.e., parallel to the surfaces of the wafers 200.

At this time, the APC valve 244 is properly controlled to adjust the internal pressure of the process chamber 201, for example, in a range of 50 Pa to 3000 Pa. The flow rate of the $BCl_3$ gas controlled by the MFC 241c is, for example, in a range of 100 sccm to 10000 sccm. The time during exposure of the wafers 200 to the $BCl_3$ gas, i.e., gas supply time (exposure time), is in a range of, for example, 1 second to 120 seconds. At this time, like in Step 1, the temperature of the heater 207 is set to a predetermined temperature so that the temperature of the wafers 200 can be in the range of, for example, 350° C. to 700° C. When the $BCl_3$ gas is activated by heat and then supplied, a soft reaction can be caused, and thus a boron-containing layer can be easily formed, which will be described later.

At this time, the gas flowing in the process chamber 201 is $BCl_3$ gas activated by heat and neither DCS gas nor $C_3H_6$ gas flows in the process chamber 201. Therefore, without causing a vapor-phase reaction, the $BCl_3$ gas which is in an activated state is supplied to the wafers 200, and at this time, as shown in FIG. 12C, a boron-containing layer having less than one atomic layer, i.e., a discontinuous boron-containing layer, is formed on a layer which includes silicon and carbon and is formed on each of the wafers 200 as a second layer in Step 2. As a result, a third layer including silicon (a first element), carbon (a second element), and boron (a third element) is formed. Meanwhile, according to conditions, a part of the second layer reacts with the $BCl_3$ gas, and thus, the second layer is modified (bronzed) to form a third layer including silicon, carbon, and boron.

The boron-containing layer formed on the second layer may be a boron layer (a B-layer), a chemical adsorption layer of $BCl_3$, that is, a chemical adsorption layer of $B_xCl_y$ (a material decomposed from $BCl_3$). Here, since boron does not couple with carbon but it couples with silicon, the boron layer is a discontinuous layer of boron, and the chemical adsorption layer of $B_xCl_y$ is a discontinuous chemical adsorption layer formed of $B_xCl_y$ molecules.

Thereafter, the valve 243c of the third gas supply pipe 232c is closed to interrupt supply of $BCl_3$ gas. At this time, in a state in which the APC valve 244 of the exhaust pipe 231 is opened, the inside of the process chamber 201 is vacuum-evacuated using the vacuum pump 246 so that $BCl_3$ gas remaining in the process chamber 201 without participating in a reaction or after participating in the formation of the boron-containing layer can be removed from the process chamber 201. At this time, in a state in which the valve 243g is opened, supply of $N_2$ gas into the process chamber 201 is continued. Due to this, $BCl_3$ gas remaining in the process chamber 201 without participating in a reaction or after participating in the formation of the boron-containing layer can be removed from the process chamber 201 more effectively. At this time, the gas remaining in the process chamber 201 may not be completely removed therefrom, that is, the inside of the process chamber 201 may not be completely purged. When a small amount of gas remains in the process chamber 201, there is no ill effect due to the remaining gas in Step 4 to be performed thereafter. At this time, there is no need to supply a large amount of $N_2$ gas into the process chamber 201. For example, a flow rate of the $N_2$ gas supplied into the process chamber 201 may be controlled to supply the same amount of gas as a capacity of the reaction tube 203 (the process chamber 201), so that the purge can be performed with no ill effect in Step 4. As described above, since the inside of the process chamber 201 is not completely purged, a purge time can be reduced and throughput can be improved. In addition, consumption of the $N_2$ gas can be maximally suppressed.

As a boron-containing gas, not only $BCl_3$ gas but also another gas such as diborane ($B_2H_6$) gas may be used.

[Step 4]

After removal of the gas remaining in the process chamber 201, the valve 243d of the fourth gas supply pipe 232d is opened to allow a flow of $NH_3$ gas through the fourth gas supply pipe 232d. The flow rate of the $NH_3$ gas flowing through the fourth gas supply pipe 232d is controlled by the MFC 241d. Then, the $NH_3$ gas whose flow rate is controlled is supplied into the process chamber 201 through the gas supply holes 250d of the fourth nozzle 249d, horizontally flows on the surfaces of the wafers 200, and is exhausted through the gas exhaust pipe 231. At this time, the valve 243h is also opened to allow a flow of $N_2$ gas through the inert gas supply pipe 232h. Then, together with the $NH_3$ gas, the $N_2$ gas is supplied into the process chamber 201, horizontally flows on the surfaces of the wafers 200, and is exhausted through the exhaust pipe 231. At this time, a main flow of the gas in the process chamber 201 is in a horizontal direction, i.e., parallel to the surfaces of the wafers 200.

At this time, the APC valve 244 is properly controlled to adjust the internal pressure of the process chamber 201, for example, in a range of 50 Pa to 3000 Pa. The flow rate of the $NH_3$ gas controlled by the MFC 241d is, for example, in a range of 100 sccm to 10000 sccm. The time during exposure of the wafers 200 to the $NH_3$ gas, i.e., gas supply time (exposure time), is in a range of, for example, 1 second to 120 seconds. At this time, like in Step 1, the temperature of the heater 207 is set to a predetermined temperature so that the temperature of the wafers 200 can be in a range of, for example, 350° C. to 700° C. Since it is difficult to make the $NH_3$ gas reactive at the above-mentioned temperature range of the wafers 200 due to a high reaction temperature of the $NH_3$ gas, the process chamber 201 is kept at a relatively high pressure as mentioned above to activate the $NH_3$ gas by heat. When the $NH_3$ gas is activated by heat and then supplied, a soft reaction can be caused, and soft nitridation, which will be described later, can be performed.

At this time, the gas flowing in the process chamber 201 is thermally-activated $NH_3$ gas, and neither DCS gas nor $C_3H_6$ gas flows in the process chamber 201. Therefore, without causing a vapor-phase reaction, the activated $NH_3$ gas reacts with a part of the layer including silicon, carbon, and boron, i.e., a part of the third layer formed on each of the wafers 200 in Step 3. As a result, the third layer is nitrided and modified into a fourth layer including silicon (a first element), carbon (a second element), boron (a third element), and nitrogen (a fourth element), i.e., into a silicon boron carbonitride (SiBCN) layer.

At this time, as shown in FIG. 12D, the nitridation reaction of the third layer is not saturated. For example, when a silicon layer having several atomic layers is formed in Step 1, a carbon-containing layer having less than one atomic layer is formed in Step 2, and a boron-containing layer having less than one atomic layer is formed in Step 3, a part of the surface layer (the surface atomic layer) of the atomic layers is nitrided. That is, a region (silicon-exposed region) of the surface layer that can be nitrided is partially or entirely nitrided. In this case, so as not to entirely nitride the third layer, the nitridation of the third layer is performed under a non-saturated condition. Alternatively, according to conditions, while the surface layer and the next lower layers among the atomic layers of the third layer may be nitrided, the case where only the surface layer is nitrided is preferable because the composition ratio of the silicon boron carbonitride film can be controlled more easily. In addition, for example, even when a silicon layer having one atomic layer or less than one atomic layer is formed in Step 1, a carbon-containing layer having less than one atomic layer is formed in Step 2, and a boron-containing layer having less than one atomic layer is formed in Step 3, a part of the surface layer is nitrided in the same way. Even in this case, similarly, so as not to nitride the entire third layer, nitridation is performed under a condition that the nitridation reaction of the third layer is not saturated.

Thereafter, the valve 243d of the fourth gas supply pipe 232d is closed to interrupt the supply of $NH_3$ gas. At this time, in a state in which the APC valve 244 of the exhaust pipe 231 is opened, the inside of the process chamber 201 is vacuum-evacuated using the vacuum pump 246 so that $NH_3$ gas remaining in the process chamber 201 without participating in the nitridation reaction or after participating in the nitridation reaction can be removed from the process chamber 201. Furthermore, at this time, in a state in which the valve 243h is opened, supply of $N_2$ gas into the process chamber 201 is continued. Due to this, $NH_3$ gas remaining in the process chamber 201 without participating in the nitridation reaction or after participating in the nitridation reaction can be removed from the process chamber 201 more effectively. At this time, the gas remaining in the process chamber 201 may not be completely removed therefrom, that is, the inside of the process chamber 201 may not be completely purged. When a small amount of gas remains in the process chamber 201, there is no ill effect in Step 1 to be performed thereafter. At this time, there is no need to supply a large amount of $N_2$ gas into the process chamber 201. For example, a flow rate of the $N_2$ gas supplied into the process chamber 201 may be controlled to supply the same amount of gas as a capacity of the reaction tube 203 (the process chamber 201), so that the purge can be performed with no ill effect in Step 1. As described above, as the inside of the process chamber 201 is not completely purged, a purge time can be reduced and throughput can be improved. In addition, consumption of the $N_2$ gas can be maximally suppressed.

As a nitrogen-containing gas, not only $NH_3$ gas but also another gas such as $N_2$ gas, $NF_3$ gas, $N_2H_4$ gas or $N_3H_8$ gas may be used.

By setting the above-described Step 1 to Step 4 to one cycle and performing this cycle at least once, a thin film including silicon (a first element), carbon (a second element), boron (a third element), and nitrogen (a fourth element), i.e., a silicon boron carbonitride (SiBCN) film, can be formed on each of the wafers 200 to a predetermined thickness. Preferably, the cycle may be repeated a plurality of times.

In Step 2, the internal pressure of the process chamber 201, or the internal pressure of the process chamber 201 and the gas supply time are controlled to be higher or longer than the internal pressure of the process chamber 201, or the internal pressure of the process chamber 201 and the gas supplying time in Step 2 when the silicon boron carbonitride film having a stoichiometric composition is formed. By controlling the process conditions in this way, in comparison with the case where the silicon boron carbonitride film is formed to have the stoichiometric composition, carbon can be excessively supplied in Step 2 (refer to FIG. 13B). Therefore, due to the excessive supply of carbon in Step 2, a region (silicon-exposed region) in which the nitridation reaction of the third layer can be caused in Step 4 is reduced. That is, in comparison with the case where the silicon boron carbonitride film is formed to have the stoichiometric composition, an excessive number of carbon atoms are supplied in Step 2, and thus, in Step 4, the nitridation reaction of the third layer is suppressed. As a result, the composition ratio of the silicon boron carbonitride (SiBCN) film can be controlled such that carbon (C) is excessive in comparison with nitrogen (N) in terms of the stoichiometric composition.

In the upper side of FIG. 13, schematic partial section views of a wafer are shown to explain reaction states in steps during formation of a SiBCN film having a stoichiometric composition. In the lower side of FIG. 13, schematic partial section views of a wafer are shown to explain reaction states in steps during formation of a SiBCN film having excessive carbon (C) in comparison with nitrogen (N) in terms of the stoichiometric composition by excessively supplying carbon (C). FIG. 13A to 13D illustrate reaction states in Step 1 to Step 4, respectively.

Alternatively, in Step 4, the internal pressure of the process chamber 201, or the internal pressure of the process chamber 201 and the gas supply time are controlled to be lower or shorter than the internal pressure of the process chamber 201, or the internal pressure of the process chamber 201 and the gas supplying time in Step 4 when the silicon boron carbonitride film having the stoichiometric composition is formed. By controlling the process conditions in this way, in comparison with the case where the silicon boron carbonitride film is formed to have the stoichiometric composition, nitrogen is insufficiently supplied in Step 4. Therefore, due to the insufficient supply of nitrogen in Step 4, the nitridation reaction of the third layer is suppressed in Step 4. That is, in comparison with the case where the silicon boron carbonitride film is formed to have the stoichiometric composition, an insufficient number of nitrogen atoms are supplied in Step 4, and thus, in Step 4, the nitridation reaction of the third layer is suppressed. As a result, the composition ratio of the silicon boron carbonitride (SiBCN) film can be controlled such that carbon (C) is excessive in comparison with nitrogen (N) in terms of the stoichiometric composition.

In the upper side of FIG. 14, schematic partial section views of a wafer are shown to explain reaction states in steps during formation of a SiBCN film having a stoichiometric composition. In the lower side of FIG. 14, schematic partial section views of a wafer are shown to explain reaction states in steps during formation of a SiBCN film having excessive carbon (C) in comparison with nitrogen (N) in terms of the stoichiometric composition by insufficiently supplying nitrogen (N). FIGS. 14A to 14D illustrate reaction states in Step 1 to Step 4, respectively.

As described above, in the third sequence of the embodiment, the internal pressure of the process chamber 201, or the internal pressure of the process chamber 201 and the gas supply time are controlled in each step to control a balance between a supply amount (deposition amount) of silicon in Step 1, a supply amount (adsorption amount or reaction amount) of carbon in Step 2, a supply amount (adsorption amount or deposition amount) of boron in Step 3 and a supply amount (reaction amount) of nitrogen in Step 4, such that the composition ratio of the silicon boron carbonitride film is controlled. Meanwhile, in the third sequence of the embodiment, as the balance between the supply amount (deposition amount) of silicon in Step 1, the supply amount (adsorption amount or reaction amount) of carbon in Step 2, the a supply amount (adsorption amount or deposition amount) of boron in Step 3 and the supply amount (reaction amount) of nitrogen in Step 4 is controlled, formation of the silicon boron carbonitride film having the stoichiometric composition is also possible. Even in this case, control of the balance between the supply amount (deposition amount) of silicon in Step 1, the supply amount (adsorption amount or reaction amount) of carbon in Step 2, the a supply amount (adsorption amount or deposition amount) of boron in Step 3 and the supply amount (reaction amount) of nitrogen in Step 4 is performed by controlling the internal pressure of the process chamber 201, or the internal pressure of the process chamber 201 and the gas supply time in each step.

After a silicon boron carbonitride film having a predetermined composition and thickness is formed in the film-forming process, gas purge, replacement with inert gas, return to the atmospheric pressure, boat unloading, and wafer discharging are performed in the same way as in the first sequence.

In the above-described example of the third sequence of the embodiment, while a silicon-containing gas, a carbon-containing gas, a boron-containing gas, and a nitrogen-containing gas are used as a first element-containing gas, a second element-containing gas, a third element-containing gas, and a fourth element-containing gas, respectively, to form a SiBCN film, the present invention is not limited to the example but various changes and modifications can be made without departing from the scope of the present invention.

For example, a silicon-containing gas, a carbon-containing gas, an oxygen-containing gas, and a nitrogen-containing gas may be used as a first element-containing gas, a second element-containing gas, a third element-containing gas, and a fourth element-containing gas, respectively, to form a silicon oxygen carbonitride (SiOCN) film. In this case, alternatively, a nitrogen-containing gas and an oxygen-containing gas may be used as a third element-containing gas and a fourth element-containing gas, respectively. In addition, for example, a silicon-containing gas, an aluminum-containing gas, a titanium-containing gas, and a nitrogen-containing gas may be used as a first element-containing gas, a second element-containing gas, a third element-containing gas, and a fourth element-containing gas, respectively, to form a silicon aluminum titanium nitride (SiAlTiN) film. Furthermore, for example, a silicon-containing gas, a carbon-containing gas, a silicon-containing gas, and a nitrogen-containing gas may be used as a first element-containing gas, a second element-containing gas, a third element-containing gas, and a fourth element-containing gas, respectively, to form a silicon carbonitride (SiCN) film. In this way, a three-element thin film may be formed. That is, for example, using the same gas as the first element-containing gas and the third element-containing gas, the third sequence can be used to form a three-element thin film. The same gas species as gas species exemplified in the description of the first sequence may also be used.

In the third sequence of the embodiment, a semiconductor element such as silicon (Si) or boron (B), or a metal element such as aluminum (Al) or titanium (Ti) may be used as a first element; an element such as nitrogen (N), boron (B), carbon (C), or oxygen (O), or a metal element such as aluminum (Al) or titanium (Ti) may be used as a second element or a third element; and an element such as nitrogen (N) or oxygen (O) may be used as a fourth element.

In the conventional CVD method, as described above, while the high film-forming rate can be obtained, the thinning of the film is limited, and it is difficult to satisfy requirements of the thinning of the film due to further miniaturization. Meanwhile, in the conventional CVD method, a plurality of kinds of gases including a plurality of elements constituting a thin film to be formed are simultaneously supplied. In this case, in order to control the composition ratio of a thin film to be formed, for example, the ratio of gas supply flow rates may be controlled when gases are supplied. In this case, even when supply conditions such as a temperature of a substrate, the internal pressure of the process chamber, and the gas supply time are adjusted when the gases are supplied, the composition ratio of the thin film cannot be controlled.

Furthermore, in the case of the ALD method, as described above, while requirements of the thinning of the film can be satisfied, it is difficult to realize the high film-forming rate. Meanwhile, in the case of the ALD method, a plurality of kinds of gases including a plurality of elements constituting a thin film to be formed are supplied in turn. In this case, in order to control the composition ratio of a thin film to be formed, for example, a gas supply flow rate and gas supply time may be controlled when each gas is supplied. In the ALD method, a source gas is supplied to a substrate for the purpose of adsorption saturation of the source gas on the substrate, and thus, pressure control in the process chamber is unnecessary. That is, since adsorption saturation of the source gas occurs at a pressure equal to or lower than a predetermined pressure at which the source gas is adsorbed for a given reaction temperature, only when the internal pressure of the process chamber is kept at the predetermined pressure or less, adsorption saturation of the source gas can be realized at any pressures in the range. Therefore, generally, in a film-forming process performed by the ALD method, the internal pressure of a process chamber is allowed to be determined according to the exhausting ability of a substrate processing apparatus in relation with the gas supply amount. However, when the internal pressure of a process chamber should be varied, chemical adsorption of the source gas on the surface of the substrate may be hindered, or a reaction may become similar to a CVD reaction, thereby making it difficult to properly perform a film-forming process by the ALD method. In addition, since an ALD reaction (adsorption saturation, surface reaction) is repeatedly performed to form a thin film to a predetermined thickness by the ALD method, when the ALD reaction is not sufficiently performed to a saturation level in each ALD reaction, deposition may also be insufficient, and a sufficient deposition rate cannot be obtained. Therefore, in the case of the ALD method, it is difficult to control the composition ratio of the thin film by controlling the internal pressure of the process chamber.

However, according to the embodiments of the present invention, in any one of the first sequence, the second sequence, and the third sequence, under the conditions that a CVD reaction is caused, a step of supplying a gas containing an element being able to become solid state by itself to the wafers, a step of supplying a gas containing an element being able to become solid state by itself or being unable to become solid state by itself to the wafers, and a step of supplying a gas containing an element being unable to become solid state by itself to the wafers are properly combined as one cycle, and the cycle is performed at least once to form a thin film to a predetermined thickness. At this time, the internal pressure of the process chamber, or the internal pressure of the process chamber and the gas supply time are controlled in each step to control the composition ratio of the thin film.

In the embodiment, in each sequence, under the conditions that the CVD reaction is caused, since the step of supplying a gas containing an element being able to become solid state by itself to the wafers, the step of supplying a gas containing an element being able to become solid state by itself or being unable to become solid state by itself to the wafers, and the step of supplying a gas containing an element being unable to become solid state by itself to the wafers are properly combined as one cycle, and the cycle is performed at least once to form the thin film to a predetermined thickness, it is possible to realize the high film-forming rate, which is not realized in the ALD method, and it is also possible to satisfy requirements of the thinning of the film, which is impossible in the conventional CVD method. Furthermore, in the embodiment, when a film is formed on a concave part such as a deep trench, it is possible to realize high step coverage, which is not realized in the conventional CVD method, and it is also possible to realize step coverage equal to or higher than that of the ALD method. That is, according to the embodiment, defects of the conventional CVD and ALD methods can be solved, requirements of the thinning of the film according to further miniaturization can be satisfied, and the high film-forming rate can be realized.

While the respective steps may be properly combined, in each cycle of each sequence of the embodiment, first (as a first step), under the conditions that the CVD reaction occurs, a step of supplying a gas containing an element being able to become solid state by itself to the wafers is performed, and finally (as a final step), a step of supplying a gas containing an element being unable to become solid state by itself to the wafers is performed. As a sequence of the steps is defined as described above, controllability of the composition ratio of the thin film can be further improved.

In addition, in the embodiment, since the composition ratio of a thin film is controlled by controlling the internal pressure of the process chamber in each step, influence of mechanical deviation between different substrate processing apparatuses can be reduced. That is, by using the same control method in the different substrate processing apparatuses, the composition ratio of thin films can be equally controlled. In this case, when the gas supply time is also controlled in each step, the composition ratio of the thin film can be finely controlled, and thus the controllability of the composition ratio of the thin film can be improved. Furthermore, by controlling the internal pressure of the process chamber in each step, the composition ratio of the thin film can be controlled while increasing the film-forming rate. That is, by controlling the internal pressure of the process chamber, the composition ratio of the thin film can be controlled, for example, while increasing the growth rate of the silicon layer in Step 1 of each sequence. As described above, according to the embodiments of the present invention, even when a different substrate processing apparatus is used, the composition ratio of the thin film can be equally controlled using the same control method, and thus the controllability of the composition ratio of the thin film can be improved, and furthermore, the film-forming rate, i.e., productivity, can be improved.

In a film-forming process by the ALD method, when the composition ratio of the thin film is controlled by adjusting the supply flow rate or supply time of a gas in each step, the influence of mechanical deviation in the different substrate processing apparatuses is increased. That is, although the same control is performed among different substrate processing apparatuses, the composition ratio of the thin film is not equally controlled. For example, although the supply flow rate and time of the gas are set to the same values for different substrate processing apparatuses, the internal pressures of process chambers are not equal due to mechanical deviation. Therefore, in this case, since the internal pressures of the process chambers are different from one substrate processing apparatus to another, control for a desired composition ratio cannot be performed in the same manner in the different substrate processing apparatuses. In addition, when the internal pressure of the process chamber is varied from one substrate processing apparatus to another, chemical adsorption of the source gas on the surface of the substrate may be hindered, or a reaction may become similar to the CVD reaction, thereby making it difficult to perform the film-forming process properly according to the ALD method.

FIRST EXAMPLE

Next, a first example will be described.

Using silicon (Si) as a first element and nitrogen (N) as a second element, a silicon nitride (SiN) film was formed while controlling the composition ratio of the silicon nitride film according to the first sequence of the embodiment, and then, the composition ratio was measured. DCS gas was used as a first element-containing gas, and $NH_3$ gas was used as a second element-containing gas. The composition ratio control was performed by adjusting the pressure or gas supply time (exposure time) which is a composition ratio control factor. As the pressure or gas supply time was increased, a reaction was increased, and thus the thickness of a layer was increased in a corresponding process. That is, a greater amount of a substance (more atoms) was supplied in the process.

First, a silicon nitride ($Si_3N_4$) film having standard stoichiometric composition (N/Si≈1.33) was formed on the wafer. At that time, process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds
(Second Step)
Temperature in process chamber: 630° C.
Pressure in process chamber: 532 Pa (4 Torr)
Flow rate of $NH_3$ gas: 9 slm
Exposure time to $NH_3$ gas: 24 seconds By adjusting process conditions based on the above-listed standard process conditions, formation of a silicon nitride ($Si_4N_4$) film having a composition ratio of N/Si≈1 was attempted.

As a result, it was confirmed that, by changing the exposure time to DCS gas from 12 seconds to 48 seconds in the first step, a $Si_4N_4$ film having high silicon content could be formed. That is, it was confirmed that, by increasing the exposure time to DCS gas longer than that of the standard process conditions in the first step, the $Si_4N_4$ film having high silicon content could be formed. Except for the exposure time to DCS gas in the first step, other process conditions were set equal to the standard process conditions. That is, the process conditions were set as follows.

(First Step)
Temperature in process chamber: 630° C.
Pressure in process chamber: 133 Pa (1 Torr)
Flow rate of DCS gas: 1 slm
Exposure time to DCS gas: 48 seconds
(Second Step)
Temperature in process chamber: 630° C.
Pressure in process chamber: 532 Pa (4 Torr)
Flow rate of $NH_3$ gas: 9 slm
Exposure time to $NH_3$ gas: 24 seconds Alternatively, it was also confirmed that, by changing the internal pressure of the process chamber from 133 Pa (1 Torr) to 266 Pa (2 Torr) in the first step, a $Si_4N_4$ film having high silicon content could be formed. That is, it was also confirmed that, by increasing the internal pressure of the process chamber higher than that of the standard process conditions in the first step, the $Si_4N_4$ film having high silicon content could be formed. Except for the internal pressure of the process chamber in the first step, other process conditions were set equal to the standard process conditions. That is, the process conditions were set as follows.

(First Step)
Temperature in process chamber: 630° C.
Pressure in process chamber: 266 Pa (2 Torr)
Flow rate of DCS gas: 1 slm
Exposure time to DCS gas: 12 seconds
(Second Step)
Temperature in process chamber: 630° C.
Pressure in process chamber: 532 Pa (4 Torr)
Flow rate of $NH_3$ gas: 9 slm
Exposure time to $NH_3$ gas: 24 seconds Alternatively, it was also confirmed that, by changing the exposure time to $NH_3$ gas from 24 seconds to 6 seconds in the second step, a $Si_4N_4$ film having relatively high silicon content could be formed because the nitrogen content was reduced. That is, it was also confirmed that, by decreasing the exposure time to $NH_3$ gas shorter than that of the standard process conditions in the second step, the $Si_4N_4$ film having high silicon content could be formed. Except for the exposure time to $NH_3$ in the second step, other process conditions were set equal to the standard process conditions. That is, the process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds
(Second Step)
Temperature in process chamber: 630° C.
Pressure in process chamber: 532 Pa (4 Torr)
Flow rate of $NH_3$ gas: 9 slm
Exposure time to $NH_3$ gas: 6 seconds Alternatively, it was also confirmed that, by changing the internal pressure of the process chamber from 532 Pa (4 Torr) to 133 Pa (1 Torr) in the second step, similarly, a $Si_4N_4$ film having high silicon content could be formed. That is, it was also confirmed that, by decreasing the internal pressure of the process chamber lower than that of the standard process conditions in the second step, the $Si_4N_4$ film having high silicon content could be formed. That is, the process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds (Second Step)
Temperature in process chamber: 630° C.
Pressure in process chamber: 133 Pa (1 Torr)
Flow rate of $NH_3$ gas: 9 slm
Exposure time to $NH_3$ gas: 24 seconds By changing the Si/N composition ratio of the silicon nitride film as described in the example, film properties such as charge density of the silicon nitride film can be controlled, and thus the silicon nitride film whose film properties are controlled can be used as a charge trapping film of a flash memory. In addition, by changing the Si/N composition ratio of the silicon nitride film as described in the example, the optical refractive index or absorption coefficient of the silicon nitride film can be controlled, and thus the silicon nitride film whose optical refractive index or absorption coefficient is controlled can be used as an anti-reflection film in a lithography process.

SECOND EXAMPLE

Next, a second example will be described.

Using silicon (Si) as a first element, carbon (C) as a second element, and nitrogen (N) as a third element, a silicon carbonitride (SiCN) film was formed while controlling the composition ratio of the silicon carbonitride film according to the second sequence of the embodiment, and then, the composition ratio was measured. DCS gas was used as a first element-containing gas, $C_3H_6$ gas was used as a second element-containing gas, and $NH_3$ gas was used as a third element-containing gas. The composition ratio control was performed by adjusting the pressure or gas supply time (exposure time) which is a composition ratio control factor. Like the case of controlling the composition ratio of a two-element film, when the composition ratio of a three-element film was controlled, as the pressure or gas supply time was increased, a reaction was increased, and thus the thickness of the layer was also increased in a corresponding process. That is, more atoms were supplied in the process.

First, a silicon carbonitride film having a standard composition (8 atoms % carbon) was formed on a wafer. At that time, process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 8 seconds
(Third Step)
Temperature in process chamber: 630° C.
Pressure in process chamber: 931 Pa (7 Torr)
Flow rate of $NH_3$ gas: 9 slm
Exposure time to $NH_3$ gas: 18 seconds By adjusting process conditions based on the above-listed standard process conditions, formation of a silicon carbonitride (SiCN) film having 16 atoms % carbon was attempted.

It was confirmed that, by changing the exposure time to $C_3H_6$ gas from 8 seconds to 16 seconds in the second step, a SiCN film having high carbon content could be formed. That is, it was confirmed that, by increasing the exposure time to $C_3H_6$ gas longer than that of the standard process conditions in the second step, the SiCN film having high carbon content could be formed. It was confirmed that as the content of carbon was increased, the content of nitrogen was decreased.

Except for the exposure time to $C_3H_6$ gas in the second step, other process conditions were set equal to the standard process conditions. That is, the process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 16 seconds
(Third Step)
Temperature in process chamber: 630° C.
Pressure in process chamber: 931 Pa (7 Torr)
Flow rate of $NH_3$ gas: 9 slm
Exposure time to $NH_3$ gas: 18 seconds Alternatively, it was also confirmed that, by changing the internal pressure of the process chamber from 133 Pa (1 Torr) to 266 Pa (2 Torr) in the second step, a SiCN film having high carbon content could be formed. That is, it was also confirmed that, by increasing the internal pressure of the process chamber higher than that of the standard process conditions in the second step, the SiCN film having high carbon content could be formed. It was also confirmed that as the content of carbon was increased, the content of nitrogen was decreased. Except for the internal pressure of the process chamber in the second step, other process conditions were set equal to the standard process conditions. That is, the process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds
(Second Step)
Temperature in process chamber: 630° C.
Pressure in process chamber: 266 Pa (2 Torr)
Flow rate of $C_3H_6$ gas: 1 slm
Exposure time to $C_3H_6$ gas: 8 seconds
(Third Step)
Temperature in process chamber: 630° C.
Pressure in process chamber: 931 Pa (7 Torr)
Flow rate of $NH_3$ gas: 9 slm
Exposure time to $NH_3$ gas: 18 seconds Alternatively, it was also confirmed that, by changing the exposure time to $NH_3$ gas from 18 seconds to 6 seconds in the third step, a SiCN film having relatively high carbon content could be formed because the content of nitrogen was reduced. That is, it was also confirmed that, by decreasing the exposure time to $NH_3$ gas shorter than that of the standard process conditions in the third step, the SiCN film having high carbon content could be formed. Except for the exposure time to $NH_3$, other process conditions were set equal to the standard process conditions. That is, the process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 8 seconds (Third Step)
Temperature in process chamber: 630° C.
Pressure in process chamber: 931 Pa (7 Torr)
Flow rate of $NH_3$ gas: 9 slm
Exposure time to $NH_3$ gas: 6 seconds Alternatively, it was also confirmed that, by changing the internal pressure of the process chamber from 931 Pa (7 Torr) to 266 Pa (2 Torr) in the third step, similarly, a SiCN film having high carbon content could be formed. That is, it was also confirmed that, by decreasing the internal pressure of the process chamber lower than that of the standard process conditions in the third step, the SiCN film having high carbon content could be formed. Except for the internal pressure of the process chamber, other process conditions were set equal to the standard process conditions. That is, the process conditions were set as follows.

(First Step)
Temperature in process chamber: 630° C.
Pressure in process chamber: 133 Pa (1 Torr)
Flow rate of DCS gas: 1 slm
Exposure time to DCS gas: 12 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 8 seconds
(Third Step)
Temperature in process chamber: 630° C.
Pressure in process chamber: 266 Pa (2 Torr)
Flow rate of $NH_3$ gas: 9 slm
Exposure time to $NH_3$ gas: 18 seconds By changing the C/N composition ratio of a silicon carbonitride film as described in the example, film properties such as etch resistance of the silicon carbonitride film can be improved, and thus the silicon carbonitride film can be used as an etch stopper film.

When silicon (Si) is used as a first element, nitrogen (N) is used as a second element, and oxygen (O) is used as a third element to form a silicon oxynitride (SiON) film while controlling the composition ratio of the silicon oxynitride film according to the second sequence of the embodiment, the O/N composition ratio of the silicon oxynitride film can be varied to reduce the dielectric constant of the silicon oxynitride film lower than that of a $Si_3N_4$ film and improve the etch resistance of the silicon oxynitride film higher than that of a $SiO_2$ film for use in a variety of fields.

THIRD EXAMPLE

Next, a third example will be described.

Using silicon (Si) as a first element, carbon (C) as a second element, nitrogen (N) as a third element and oxygen (O) as a fourth element, a silicon oxygen carbonitride (SiOCN) film was formed while controlling the composition ratio of the silicon oxygen carbonitride film according to the third sequence of the embodiment, and then, the composition ratio was measured. DCS gas was used as a first element-containing gas, $C_3H_6$ gas was used as a second element-containing gas, $NH_3$ gas was used as a third element-containing gas, and $O_2$ gas was used as a fourth element-containing gas. The composition ratio control was performed by adjusting the pressure or gas supply time (exposure time) which is a composition ratio control factor. Like the case of controlling the composition ratio of a three-element film, when the composition ratio of a four-element film was controlled, as the pressure or gas supply time was increased, a reaction was increased, and thus the thickness of the layer was also increased in a corresponding process. That is, more atoms were supplied in the process.

First, a SiOCN film having a standard composition (8 atoms % carbon) was formed on a wafer. At that time, process conditions were set as follows.

(First Step)
Temperature in process chamber: 630° C.
Pressure in process chamber: 133 Pa (1 Torr)
Flow rate of DCS gas: 0.2 slm
Exposure time to DCS gas: 6 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 12 seconds
(Third Step)
Temperature in process chamber: 630° C.
Pressure in process chamber: 866 Pa (6.5 Torr)
Flow rate of $NH_3$ gas: 4.5 slm
Exposure time to $NH_3$ gas: 18 seconds
(Fourth Step)
Temperature in process chamber: 630° C.
Pressure in process chamber: 133 Pa (1 Torr)
Flow rate of $O_2$ gas: 1 slm
Exposure time to $O_2$ gas: 18 seconds By adjusting process conditions based on the above-listed standard process conditions, formation of a SiOCN film having 16 atoms % carbon was attempted.

It was confirmed that, by changing the exposure time to $C_3H_6$ gas from 12 seconds to 36 seconds in the second step, a SiOCN film having high carbon content could be formed. That is, it was confirmed that, by increasing the exposure time to $C_3H_6$ gas longer than that of the standard process conditions in the second step, the SiOCN film having high carbon content could be formed. It was confirmed that as the content of carbon was increased, the content of nitrogen was decreased. Except for the exposure time to $C_3H_6$ gas in the second step, other process conditions were set equal to the standard process conditions. That is, the process conditions were set as follows.

(First Step)
Temperature in process chamber: 630° C.
Pressure in process chamber: 133 Pa (1 Torr)
Flow rate of HCD gas: 0.2 slm
Exposure time to HCD gas: 6 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 36 seconds
(Third Step)
Temperature in process chamber: 630° C.
Pressure in process chamber: 866 Pa (6.5 Torr)
Flow rate of $NH_3$ gas: 4.5 slm
Exposure time to $NH_3$ gas: 18 seconds
(Fourth Step)
Temperature in process chamber: 630° C.
Pressure in process chamber: 133 Pa (1 Torr)
Flow rate of $O_2$ gas: 1 slm
Exposure time to $O_2$ gas: 18 seconds Alternatively, it was also confirmed that, by changing the internal pressure of the process chamber from 133 Pa (1 Torr) to 866 Pa (6.5 Torr) in the second step, a SiOCN film having high carbon content could be formed. That is, it was also confirmed that, by increasing the internal pressure of the process chamber higher than that of the standard process conditions in the second step, the SiOCN film having high carbon content could be formed. It was also confirmed that as the content of carbon was increased, the content of nitrogen was decreased. Except for the internal pressure of the process chamber in the second step, other process conditions were set equal to the standard process conditions. That is, the process conditions were set as follows.

(First Step)
Temperature in process chamber: 630° C.
Pressure in process chamber: 133 Pa (1 Torr)
Flow rate of HCD gas: 0.2 slm
Exposure time to HCD gas: 6 seconds
(Second Step)
Temperature in process chamber: 630° C.
Pressure in process chamber: 866 Pa (6.5 Torr)
Flow rate of $C_3H_6$ gas: 1 slm
Exposure time to $C_3H_6$ gas: 12 seconds
(Third Step)
Temperature in process chamber: 630° C.
Pressure in process chamber: 866 Pa (6.5 Torr)
Flow rate of $NH_3$ gas: 4.5 slm
Exposure time to $NH_3$ gas: 18 seconds
(Fourth Step)
Temperature in process chamber: 630° C.
Pressure in process chamber: 133 Pa (1 Torr)
Flow rate of $O_2$ gas: 1 slm
Exposure time to $O_2$ gas: 18 seconds Alternatively, it was also confirmed that, by changing the exposure time to $NH_3$ gas from 18 seconds to 6 seconds in the third step, a SiOCN film having relatively high carbon content could be formed because the content of nitrogen was reduced. That is, it was also confirmed that, by decreasing the exposure time to $NH_3$ gas shorter than that of the standard process conditions in the third step, the SiOCN film having high carbon content could be formed. Except for the exposure time to $NH_3$, other process conditions were set equal to the standard process conditions. That is, the process conditions were set as follows.

(First Step)
Temperature in process chamber: 630° C.
Pressure in process chamber: 133 Pa (1 Torr)
Flow rate of HCD gas: 0.2 slm
Exposure time to HCD gas: 6 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 12 seconds
(Third Step)
Temperature in process chamber: 630° C.
Pressure in process chamber: 866 Pa (6.5 Torr)
Flow rate of $NH_3$ gas: 4.5 slm
Exposure time to $NH_3$ gas: 6 seconds
(Fourth Step)
Temperature in process chamber: 630° C.
Pressure in process chamber: 133 Pa (1 Torr)
Flow rate of $O_2$ gas: 1 slm
Exposure time to $O_2$ gas: 18 seconds Alternatively, it was also confirmed that, by changing the internal pressure of the process chamber from 866 Pa (6.5 Torr) to 133 Pa (1 Torr) in the third step, similarly, a SiOCN film having high carbon content could be formed. That is, it was also confirmed that, by decreasing the internal pressure of the process chamber lower than that of the standard process conditions in the third step, the SiOCN film having high carbon content could be formed. Except for the internal pressure of the process chamber, other process conditions were set equal to the standard process conditions. That is, the process conditions were set as follows.

(First Step)
Temperature in process chamber: 630° C.
Pressure in process chamber: 133 Pa (1 Torr)
Flow rate of HCD gas: 0.2 slm
Exposure time to HCD gas: 6 seconds
(Second Step)
Temperature in process chamber: 630° C.
Pressure in process chamber: 133 Pa (1 Torr)
Flow rate of $C_3H_6$ gas: 1 slm
Exposure time to $C_3H_6$ gas: 12 seconds
(Third Step)
Temperature in process chamber: 630° C.
Pressure in process chamber: 133 Pa (1 Torr)
Flow rate of $NH_3$ gas: 4.5 slm
Exposure time to $NH_3$ gas: 18 seconds
(Fourth Step)
Temperature in process chamber: 630° C.
Pressure in process chamber: 133 Pa (1 Torr)
Flow rate of $O_2$ gas: 1 slm
Exposure time to $O_2$ gas: 18 seconds By changing the C/N composition ratio of a SiOCN film as described in the example, film properties such as etch resistance or electrical characteristics of the SiOCN film can be improved or changed, and thus the SiOCN film can be used as an etch stopper film or a spacer film.

What is claimed is:

1. A method of manufacturing a semiconductor device, comprising: (a) forming a first layer including a first element being able to become solid state by itself on a substrate by supplying a gas containing the first element into a process vessel accommodating the substrate under a condition where a CVD reaction is caused; (b) modifying the first layer by supplying a gas containing a second element being unable to become solid state by itself into the process vessel to form a second layer including the first element and the second element; and (c) performing a cycle comprising the steps (a) and (b) at least once to form a thin film having a predetermined thickness and including the first element and the second element.

2. The method of claim 1, wherein the step (a) comprises forming a deposition layer including the first element on the substrate as the first layer, and the step (b) comprises modifying the first layer under a condition where a modification reaction of the first layer is unsaturated.

3. The method of claim 2, wherein, in the step (b), the gas containing the second element is thermally activated and supplied to the substrate.

4. The method of claim 3, wherein each of the steps (a) through (c) is performed under a heated and decompressed atmosphere in a non-plasma state.

5. A method of manufacturing a semiconductor device, comprising: (a) forming a first layer including a first element being able to become solid state by itself on a substrate by supplying a gas containing the first element into a process vessel accommodating the substrate under a condition where a CVD reaction is caused; (b) supplying a gas containing a second element being able to become solid state by itself or being unable to become solid state by itself into the process vessel to form a second layer including the first element and the second element by forming a layer including the second element on the first layer or by modifying the first layer; (c) modifying the second layer by supplying a gas containing a third element being unable to become solid state by itself into the process vessel to form a third layer including the first element, the second element and the third element; and (d)

performing a cycle comprising the steps (a) through (c) at least once to form a thin film having a predetermined thickness and including the first element, the second element and the third element.

6. The method of claim 5, wherein the step (a) comprises forming a deposition layer including the first element on the substrate as the first layer, in the step (b), the second layer is formed by forming a discontinuous layer including the second element on the first layer or by modifying the first layer under a condition where a modification reaction of the first layer is unsaturated, and the step (c) comprises modifying the second layer under a condition where a modification reaction of the second layer is unsaturated.

7. The method of claim 6, wherein, in the step (b), the gas containing the second element is thermally activated and supplied to the substrate, and in the step (c), the gas containing the third element is thermally activated and supplied to the substrate.

8. The method of claim 7, wherein each of the steps (a) through (d) is performed under a heated and decompressed atmosphere in a non-plasma state.

9. A method of manufacturing a semiconductor device, comprising: (a) forming a first layer including a first element being able to become solid state by itself on a substrate by supplying a gas containing the first element into a process vessel accommodating the substrate under a condition where a CVD reaction is cased; (b) supplying a gas containing a second element being able to become solid state by itself or being unable to become solid state by itself into the process vessel to form a second layer including the first element and the second element by forming a layer including the second element on the first layer or by modifying the first layer; (c) supplying a gas containing a third element being able to become solid state by itself or being unable to become solid state by itself into the process vessel to form a third layer including the first element, the second element and the third element by forming a layer including the third element on the second layer or by modifying the second layer; and (d) modifying the third layer by supplying a gas containing a fourth element being unable to become solid state by itself into the process vessel to form a fourth layer including the first element, the second element, the third element and the fourth element; and (e) performing a cycle comprising the steps (a) through (d) at least once to form a thin film having a predetermined thickness and including the first element, the second element, the third element and fourth element.

10. The method of claim 9, wherein the step (a) comprises forming a deposition layer including the first element on the substrate as the first layer, in the step (b), the second layer is formed by forming a discontinuous layer including the second element on the first layer or by modifying the first layer under a condition where a modification reaction of the first layer is unsaturated, and in the step (c), the third layer is formed by forming a discontinuous layer including the third element on the second layer or by modifying the second layer under a condition where a modification reaction of the second layer is unsaturated, and the step (d) comprises modifying the third layer under a condition where a modification reaction of the third layer is unsaturated.

11. The method of claim 10, wherein, in the step (b), the gas containing the second element is thermally activated and supplied to the substrate, in the step (c), the gas containing the third element is thermally activated and supplied to the substrate, and in the step (d), the gas containing the fourth element is thermally activated and supplied to the substrate.

12. The method of claim 11, wherein each of the steps (a) through (e) is performed under a heated and decompressed atmosphere in a non-plasma state.

\* \* \* \* \*